(12) United States Patent
Nozawa et al.

(10) Patent No.: US 6,277,657 B1
(45) Date of Patent: Aug. 21, 2001

(54) APPARATUS FOR FABRICATING SEMICONDUCTOR DEVICE AND FABRICATION METHOD THEREFOR

(75) Inventors: Katsuya Nozawa, Osaka; Minoru Kubo, Mie; Tohru Saitoh, Osaka; Takeshi Takagi, Kyoto, all of (JP)

(73) Assignee: Matsushita Electric Industrial Co. Ltd., Osaka (JP)

( * ) Notice: Subject to any disclaimer, the term of this patent is extended or adjusted under 35 U.S.C. 154(b) by 0 days.

(21) Appl. No.: 09/530,926

(22) PCT Filed: Sep. 13, 1999

(86) PCT No.: PCT/JP99/04963

§ 371 Date: May 8, 2000

§ 102(e) Date: May 8, 2000

(87) PCT Pub. No.: WO00/16384

PCT Pub. Date: Mar. 23, 2000

(30) Foreign Application Priority Data

Sep. 14, 1998 (JP) .................................................. 10-259878
Apr. 2, 1999 (JP) .................................................. 11-095724

(51) Int. Cl.[7] .................................................. H01L 21/00
(52) U.S. Cl. .............................. 438/8; 117/97; 156/345; 216/58; 216/60; 438/706
(58) Field of Search .............................. 438/8, 267, 268, 438/706; 156/345 V, 345 MT; 117/85, 86, 97, 108, 201; 216/37, 58, 60, 79

(56) References Cited

U.S. PATENT DOCUMENTS 5,985,025    11/1999    Celii et al. .

OTHER PUBLICATIONS

Partial English Translation of Advanced Electronics Series I–10, *Molecular Beam Epitaxy*, published by Baifukan on Nov. 15, 1994.

C. Pickering et al., "Real–time spectroscopic ellipsometry monitoring of $Si_{1-x}Ge_x/Si$ epitaxial growth", J. Va. Sci, Technol. A 13(3), May/Jun. 1995, pp 740–744.

Patent Abstracts of Japan, Publication No. 01004026, Jan. 9, 1989, "Surface Cleaning".

Patent Abstracts of Japan, Publication No. 01305893, Dec. 11, 1989, "Method of Cleaning Silicon Substrate".

International Search Report.

*Primary Examiner*—William A. Powell
(74) *Attorney, Agent, or Firm*—Eric J. Robinson; Nixon Peabody LLP

(57) ABSTRACT

A crystal growing apparatus comprises a vacuum vessel, a heating lamp, a lamp controller for controlling the heating lamp, a gas inlet port, a flow rate adjuster for adjusting the flow rate of a gas, a pyrometer for measuring the temperature of a substrate, and a gas supply unit for supplying a $Si_2H_6$ gas or the like to the vacuum vessel. An apparatus for ellipsometric measurement comprises: a light source, a polariscope, a modulator, an analyzer, a spectroscope/detector unit, and an analysis control unit for calculating Ψ, Δ. In removing a chemical oxide film on the substrate therefrom, in-situ ellipsometric measurement allows a discrimination between a phase 1 during which a surface of the substrate is covered with the oxide film and a phase 2 during which the surface of the substrate is partially exposed so that the supply of gas suitable for the individual phases is performed and halted.

23 Claims, 17 Drawing Sheets

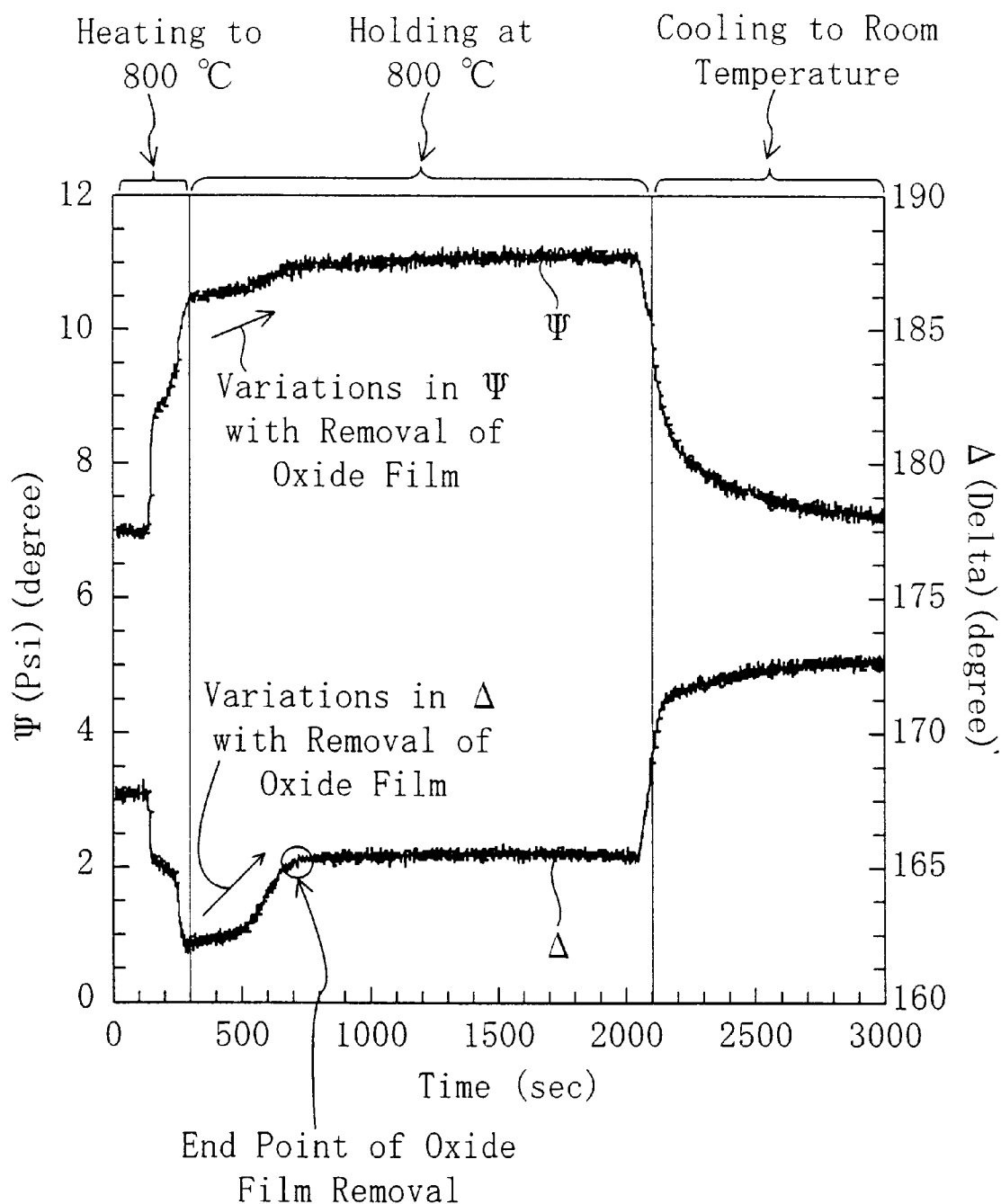

APPARATUS FOR FABRICATING SEMICONDUCTOR DEVICE AND FABRICATION METHOD THEREFOR

TECHNICAL FIELD

The present invention relates to a fabrication method suitable for use in the fabrication of a semiconductor device such as a transistor or capacitor incorporated in electronic equipment and an apparatus for fabricating the semiconductor device.

BACKGROUND ART

Technology for forming a semiconductor film on a semiconductor substrate by epitaxial growth has been used widely and conventionally in forming various semiconductor elements. For example, technology for forming a crystal of silicon, silicon germanium, or the like on a silicon substrate has been studied vigorously in recent years as technology which enables the formation of a high-performance device such as a hetero bipolar transistor. The silicon-based epitaxial growth can be effected by, e.g., UHV-CVD whereby a gas source is supplied to a surface of a semiconductor substrate that has been heated in a vacuum vessel or MBE whereby a molecular beam obtained by heating a solid source is supplied to a semiconductor substrate.

In either of the aforesaid crystal growth methods, if an impurity exists on the surface of the substrate during the epitaxial growth, the impurity forms a nucleus to cause a crystal defect, which seriously impairs the quality of a crystal layer grown. In initiating the crystal growth, therefore, the semiconductor substrate should have an extremely clean surface. Such a clean surface can be obtained by cleaning a semiconductor substrate, forming a thin (on the order of 10 to 20 Å) chemical oxide film which does not contain an impurity such as carbon on the semiconductor substrate by chemical treatment, and then removing the oxide film in the vacuum vessel.

The protective oxide film method for providing the clean surface using the chemical oxide is disclosed in detail in a paper written by Ishizaka et al. (1986 Journal of Electrochemical Society p. 666) and in a paper written by Tatsumi et al. (1985 Japanese Journal of Applied Physics Vol. 24, No.4L227).

Since a chemical oxide itself may cause a crystal defect, it should be removed completely at the initiation of crystal growth. To remove the chemical oxide, however, a heating process should be performed at a temperature (about 750 to 850° C.) higher than a temperature (about 450 to 600° C.) during the crystal growth.

If a heat treatment is performed with respect to a substrate that has been patterned for device fabrication, on the other hand, the problem of a change in impurity profile or pattern deformation occurs. To provide reliable device properties, therefore, the substrate is preferably heated to a lowest possible temperature and for a shortest possible period. Since the process of heating the chemical oxide is performed at the high temperature as described above, it will be understood that performing the heating process at a lower temperature and for a shorter period is particularly important in providing reliable device properties.

In the heating process for removing the chemical oxide, therefore, an attempt has been made conventionally to perform the heating process at a lower temperature and for a shorter period by making the following observation.

Lowering of Temperature of Reaction for Removing Oxide Film by Using Si-Containing Gas and Conventional Method for Observation Although $SiO_2$ as a main component of the chemical oxide is by itself an eminently stable material, Si composing the semiconductor substrate reacts with $SiO_2$ at the interface between the semiconductor substrate and the oxide film to generate SiO. Because SiO has high volatility, $SiO_2$ is lost gradually as SiO is generated to evaporate.

To accelerate the reaction for removing the protective oxide film, therefore, it is effective in causing a reaction for forming SiO at a surface portion of the semiconductor substrate, while supplying a gas containing Si. It has been reported by a paper written by M.Hirayama et al. (1987 Applied Physics Letters, No.51, p.2213) that the time required to remove an oxide film can be reduced from conventional 10 minutes at 840° C. to 2 minutes at the same temperature of 840° C. by introducing silane ($SiH_4$) into a vacuum vessel during the process of removing the oxide film. If the time required to remove the oxide film is maintained at the same 10 minutes, the temperature can be lowered to 815° C.

A silicon-containing gas such as silane may be supplied as it is, as disclosed in Japanese Unexamined Patent Publication No. SHO 64-4026. It is also known that the silicon-containing gas such as silane is effective if it is supplied after being cracked, as disclosed in Japanese Unexamined Patent Publication No. HEI 1-305893.

The paper and publications disclose the removal of the oxide film which is performed under observation by reflection high-energy electron diffraction (RHEED).

Problems to be Solved

However, RHEED used in the processes disclosed in the paper and publications necessitates measurement made in a vacuum chamber, so that it is impossible to make a close in-situ observation of a state change during the removal of an oxide film conducted by using an etching gas, though it is possible to detect the state in which the oxide film has been removed completely. Accordingly, it is difficult to properly change conditions for the heating process as the removal of the oxide film proceeds.

In accordance with the processing methods disclosed in the paper and publications, therefore, the oxide film is removed based on the conditions determined empirically and an optimum method of removing an oxide film responsive to a change in the state of the oxide film during the removal process has not been established yet. In particular, the mechanism of removing the oxide film has been unknown.

It is therefore an object of the present invention to provide means for making in-situ observation of the process of removing a protective oxide film and thereby providing a method of fabricating a semiconductor device and a fabrication apparatus therefor which are for properly removing the oxide film as the removal of the oxide film proceeds.

DISCLOSURE OF THE INVENTION

An apparatus for fabricating a semiconductor device of the present invention is an apparatus for fabricating a semiconductor device to be used in removing an oxide film formed on a semiconductor substrate therefrom, the apparatus comprising: a vacuum vessel for accommodating the semiconductor substrate; a substrate heating unit provided additionally in the vacuum vessel to heat the semiconductor substrate in the vacuum vessel; a gas supply unit for supplying a gas having a function of reacting with the oxide film and generating a volatile material within the vacuum vessel; a polarized light analyzing unit for detecting a state of the oxide film on the semiconductor substrate after the removing process based on a signal Δ representing a difference in phase shift between p-polarized light and s-polarized light of polarized measuring light; and a control unit for controlling a condition during the removal of the oxide film on the semiconductor substrate therefrom in accordance with the signal Δ detected by the polarized light analyzing unit.

The arrangement enables proper control of the condition for removing the oxide film responsive to the signal Δ obtained by the analysis of polarized light which allows the state of the oxide film after the removing process to be detected with high sensitivity. For example, it becomes possible to properly control, depending on the progression of the oxide film removing process, a combination of the removal of the oxide film which is conducted by allowing a gas to flow and evaporating a volatile material generated on the surface of the oxide film therefrom and the removal of the oxide film which is conducted by diffusing, in the oxide film, a volatile material generated at the interface between the oxide film and the semiconductor substrate and then evaporating the volatile material without allowing a gas to flow. As a result, it becomes possible to suppress the degradation of the properties of the semiconductor device due to a reduced time required for the removal of the oxide film, i.e., a reduced heating time and use the fabrication apparatus in fabricating a high-performance semiconductor device.

In the apparatus for fabricating a semiconductor device, the control unit preferably has a function of determining a timing of switching between a process of supplying the gas to the vacuum vessel and a process of removing the oxide film in an atmosphere in which the gas does not substantially exist without supplying the gas.

Preferably, the apparatus functions as an apparatus for epitaxial growth.

A first method of fabricating a semiconductor device of the present invention is a method of fabricating a semiconductor device comprising the step of removing an oxide film formed on a semiconductor substrate therefrom in a vacuum vessel, wherein the step of removing the oxide film includes allowing to flow a gas which reacts with the oxide film and generates a volatile material within the vacuum vessel, while heating the semiconductor substrate, until a specified time elapses from an initiation of the step of removing the oxide film, and removing the oxide film in an atmosphere in which the gas does not substantially exist by halting a supply of the gas to the vacuum vessel and heating the semiconductor substrate after the specified time elapsed.

In accordance with the method, since the mechanism for removing the oxide film is different in the first-half period of the oxide film removing process during which the oxide film is entirely covering the semiconductor substrate and in the second-half period of the oxide film removing process which elapses since the oxide film is partially removed and the surface of the semiconductor substrate is partially exposed until the removal of the oxide film is completed, it becomes possible to rapidly remove the oxide film by principally allowing the gas to flow in the first-half period and suppress the deposition of a material derived from the gas on the exposed semiconductor substrate by principally not allowing a gas to flow in the second-half period. In short, it becomes possible to suppress the degradation of the properties of the semiconductor apparatus due to a reduced time required to remove the oxide film. i.e., a reduced heating time and keep the surface of the semiconductor substrate clean, thereby enabling fabrication of a high-performance semiconductor device.

In the first method of fabricating a semiconductor device, if a period that has elapsed since the process of removing the oxide film is initiated until the oxide film is partially lost and a part of the underlying semiconductor substrate is exposed is assumed to be a phase 1 and a period that has elapsed since the underlie is partially exposed until the removal of the oxide film is completed is assumed to be a phase 2 in the step of removing the oxide film, a specified time point at which the supply of the gas is halted is determined based on a timing with which the phase 1 shifts to the phase 2. This enables most efficient removal of the oxide film based on the degree of deposition of the material derived from the gas the use of which is permitted depending on the type of the semiconductor device to be fabricated.

In the first method of fabricating a semiconductor device, the process of removing the oxide film is monitored by an analysis of polarized light for detecting the signal Δ representing a difference in phase shift between p-polarized light and s-polarized light of polarized measuring light, the timing with which the phase 1 shifts to the phase 2 is detected from data obtained from the analysis of polarized light, and the specified time point at which the supply of the gas is halted is controlled based on the detected timing. This allows most effective adjustment of a timing with which the phase 1 shifts to the phase 2 and a timing with which the supply of the gas is halted.

In the first method of fabricating a semiconductor device, a time point at which an elapsed time from an initiation of the phase 1 reaches a specified proportion of a time required from the initiation of the phase 1 to a termination thereof is detected and the specified time point at which the supply of the gas is halted is determined based on the detected time point. This allows prompt determination of the timing with which the supply of the gas is halted through relatively simple control.

In the first method of fabricating a semiconductor device, the specified proportion is preferably not less than 50% and not more than 95%.

In the first method of fabricating a semiconductor device, at least one of respective control operations for changing a flow rate of the gas, changing a pressure of the gas, and changing a temperature of the substrate in the process of allowing the gas to flow is conducted based on the data obtained from the analysis of polarized light. This enables proper control depending on the progression of the removal of the oxide film.

In the first method of fabricating a semiconductor device, the step of removing the oxide film is preferably the step of removing an oxide film for protection before a semiconductor crystal layer is epitaxially grown on the semiconductor substrate.

A second method of fabricating a semiconductor device of the present invention is a method of fabricating a semiconductor device comprising the step of removing an oxide film formed on a semiconductor substrate therefrom in a vacuum vessel, wherein the step of removing the oxide film includes monitoring a state of the oxide film on the semiconductor substrate after the removing process by an analysis of polarized light for detecting a signal Δ representing a difference in phase shift between p-polarized light and s-polarized light of polarized measuring light and controlling a condition for removing the oxide film based on data obtained from the analysis of polarized light.

In accordance with the method, data on the thickness or the like of the oxide film varying with time is obtained with high sensitivity in the fabrication process by a so-called in-situ analysis of polarized light and the condition for removing the oxide film can be held constantly appropriately based on the obtained data. This enables the fabrication of a high-performance semiconductor device.

In the first or second method of fabricating a semiconductor device, the substrate is held at a constant temperature in conducting the analysis of polarized light, whereby the accuracy of the analysis is improved.

In the second method of fabricating a semiconductor device, the step of removing the oxide film preferably includes a process of allowing to flow a gas which reacts with the oxide film and generates a volatile material within the vacuum vessel, while heating the substrate, and the control of the condition is preferably at least one of control operations for changing an amount of the gas supplied, changing a pressure of the gas, and changing a temperature of the substrate in the process of allowing the gas to flow.

In the second method of fabricating a semiconductor device, the step of removing the oxide film is preferably the step of removing an oxide film for protection before a semiconductor crystal layer is epitaxially grown on the semiconductor substrate.

A third method of fabricating a semiconductor device is a method of fabricating a semiconductor device comprising the step of removing an oxide film formed on a semiconductor substrate therefrom in a vacuum vessel, wherein the step of removing the oxide film is assumed to include allowing to flow a gas which reacts with the oxide film and generates a volatile material within the vacuum vessel, while heating the semiconductor substrate, until a specified time elapses from an initiation of the oxide film removing process, and removing the oxide film in an atmosphere in which the gas does not substantially exist by halting a supply of the gas to the vacuum vessel and heating the semiconductor substrate after the specified time elapsed, a correlation between progression of the removal of the oxide film and at least one of a flow rate of the gas, a pressure of the gas, and a temperature of the substrate is obtained by an analysis of polarized light for detecting a signal Δ representing a phase shift difference between p-polarized light and s-polarized light of measuring light that has been polarized preliminarily, and the step of removing the oxide film includes halting the supply of the gas at the specified time determined based on the correlation.

If an in-situ analysis of polarized light is performed preliminarily in accordance with the method, proper switching between the removal of the oxide film which is conducted by heating and supplying a gas and the removal of the oxide film which is conducted only by heating without supply the gas can be performed by using the correlation between the progression of the removal of the oxide film and the condition for removing the oxide film without performing the in-situ analysis of polarized light. Briefly, the semiconductor device can be fabricated through simpler control by using the fabrication apparatus with a simpler structure.

In the third method of fabricating a semiconductor device, if a period that has elapsed since the oxide film removing process is initiated until the oxide film is partially lost and a part of the underlying semiconductor substrate is exposed is assumed to be a phase 1 and a period that has elapsed since an underlie is partially exposed until the removal of the oxide film is completed is assumed to be a phase 2, the correlation between the progression of the removal of the oxide film and the condition is a correlation between a time required by the phases 1 and 2 and the condition. This allows a proper timing of halting the supply of a gas to be determined in consideration of the difference between the mechanisms for removing the oxide film in the phases 1 and 2.

In the first, second, or third method of fabricating a semiconductor device, the gas may contain at least one of Si and Ge.

In that case, the gas may contain at least one of disilane and silane or germane.

A fourth method of fabricating a semiconductor device is a method of fabricating a semiconductor device comprising the step of removing an oxide film formed on a semiconductor substrate therefrom in a vacuum vessel, wherein, if a period that has elapsed since the oxide film removing process is initiated until the oxide film is partially lost and a part of the underlying semiconductor substrate is exposed is assumed to be a phase 1 and a period that has elapsed since the underlie is partially exposed until the removal of the oxide film is completed is assumed to be a phase 2 in the step of removing the oxide film, the substrate has different maximum temperatures in the phase 1 and in the phase 2.

In accordance with the method, it becomes possible to choose a more advantageous condition for the substrate temperature depending on the type of the semiconductor device to be fabricated in consideration of the advantages and disadvantages of a reduction in the time required to remove the oxide film, i.e., a reduction in heating time and of the prevention of adhesion of a foreign substance to the exposed surface of the semiconductor substrate. In short, a semiconductor device having desired performance compatible with the type thereof can be fabricated.

In the fourth method of fabricating a semiconductor device, the maximum temperature of the substrate in the phase 1 is higher than the maximum temperature of the substrate in the phase 2, whereby the time required to remove the oxide film is reduced.

In the fourth method of fabricating a semiconductor device, the step of removing the oxide film preferably includes allowing to flow a gas which reacts with the oxide film and generates a volatile material within the vacuum vessel, while heating the semiconductor substrate, until a specified time elapses from the initiation of the oxide film removing process, and removing the oxide film in an atmosphere in which the gas does not substantially exist by halting a supply of gas to the vacuum vessel and heating the semiconductor substrate after the specified time elapsed.

BRIEF DESCRIPTION OF THE DRAWINGS

FIG. 3 Is a view showing variations in signals Δ, Ψ obtained as a result of in-situ ellipsometric observation made in removing an oxide film by heating the oxide film to 800° C. in a vacuum atmosphere;

BEST EMBODIMENTS

The embodiments of the present invention will be described in terms of a semiconductor device to which the present invention is applied, an apparatus used, observation data, condition control, and the like.

SEMICONDUCTOR DEVICE TO WHICH PRESENT INVENTION IS APPLIED AND MEASUREMENT APPARATUS

Principle of Ellipsometric Measurement

Figure 15:
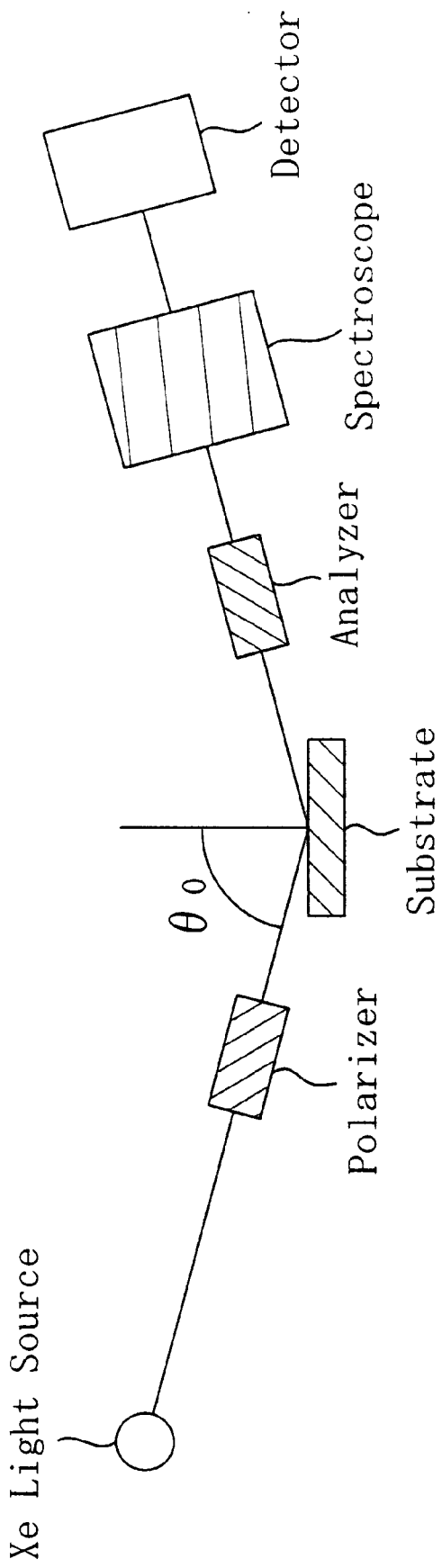
FIG. 15 is a side view schematically showing a structure of a spectroscopic ellipsometer for measuring, as an object of measurement, a portion of an epitaxial region of a substrate on which a chemical oxide is to be formed.

FIG. 15 is a side view schematically showing a structure of a spectroscopic ellipsometer (spectroscopic ellipsometric measurement apparatus) for measuring, as an object of measurement, a portion of an epitaxial region of a substrate on which a chemical oxide is to be formed. The spectroscopic ellipsometer is structured such that Xe light outputted from a Xe light source is changed into linearly polarized light by means of a polarizer to be incident upon a substrate at an angle $θ_0$ with respect to a direction perpendicular to the substrate surface and reflected thereby as elliptically polarized light. The elliptically polarized light then passes through an analyzer to be incident upon a spectroscope, while being split, such that respective complex indices of refraction $N=n-ik$ at individual wavelengths are measured by a detector. However, the axis of the linearly polarized light of the incident light is tilted with respect to the p-direction (direction of an intersecting line between a plane perpendicular to the optical axis and a plane containing the incident light and the reflected light) and to the s-direction (direction perpendicular to the p direction in the plane perpendicular to the optical axis).

The reflectance for the p-polarized light and the reflectance for the s-polarized light are different from sample to sample. If the complex index of reflection for the p-polarized light p is assumed to be Rp and the complex index of reflection for the s-polarized light is assumed to be Rs, the ratio ρ=Rp/Rs of Rp to Rs becomes a complex number.

If Ψ, Δ are defined on the assumption that $ρ=\tan Ψ \, e^{iΔ}$ is satisfied, i.e., $Ψ = \tan^{-1}|ρ|$ $Δ = \arg |ρ|$ are satisfied, the complex number ρ can be expressed by using the two real numbers Ψ, Δ. The two quantities Ψ, Δ are fundamental quantities in ellipsometry, of which Ψ is termed an amplitude reflectance ratio and Δ is termed a phase difference.

Ψ, Δ A have close relationships with the optical constant of a sample. If the sample is a flat plate having a single composition and a sufficiently large thickness, the relationships between the complex index of refraction $N=n-ik$ of the substrate and Ψ, Δ are given by the following equations (1) and (2) where $θ_0$ is the angle formed between the incident light and a normal to the substrate.

$$n^2-k^2=\sin^2θ_0[1+\{\tan^2θ_0(\cos^22Ψ-\sin^22Ψ\sin^2Δ)/(1+\sin 2Ψ\cos Δ)^2\}] \quad (1)$$

$$2nk=(\sin^2θ_0\tan^2θ_0\sin 4Ψ\sin Δ)/(1+\sin 2Ψ\cos Δ)^2\} \quad (2)$$

In the case where a thin film is formed on a surface of the sample and the interface between the surface and the thin film is not smooth, the relationships between the complex index of refraction of the sample and Ψ, Δ are more complicated.

Under such circumstances, the present inventors have found that important data on the removal of the chemical oxide can be obtained by measuring the Ψ, Δ of the reflected light from the sample without determining the complex index N of refraction of the sample, which will be described later.

Example of Semiconductor Device and Fabrication Process

Figure 16:
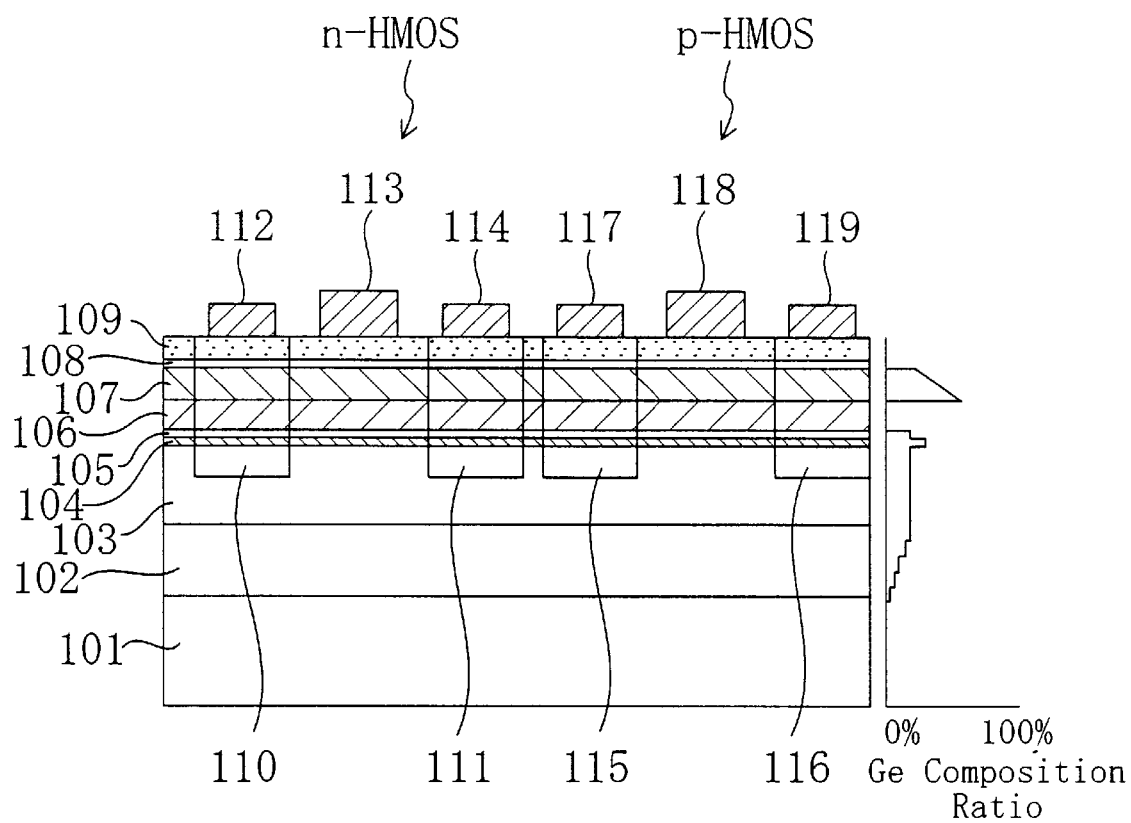
FIG. 16 is a cross-sectional view of a HCMOS device as a type of a hetero field-effect transistor according to an embodiment of the present invention.

FIG. 16 is a cross-sectional view of a HCMOS device which is a type of a hetero field-effect transistor according to an embodiment of the present invention. As shown in the drawing, a SiGe relaxed buffer layer 102, a SiGe buffer layer 103, an n-type heavily doped layer 104, a spacer layer 105, an n-channel layer 106, a p-channel layer 107, a Si cap layer 108, and a gate insulating film 109 are formed successively on a Si substrate 101. On the substrate, there are provided respective gate electrodes 113 and 118 of an n-channel field-effect transistor (hereinafter referred to as an n-HMOS) and a p-channel field-effect transistor (hereinafter referred to as a p-HMOS). An n-type impurity has been introduced into a part of each of the SiGe buffer layer 103, the n-type heavily doped layer 104, the spacer layer 105, the n-channel layer 106, the p-channel layer 107, and the Si cap layer 108 which are positioned on both side of the gate electrode 113, whereby the source region 110 and drain region 111 of the n-HMOS are formed. On the other hand, a p-type impurity has been introduced into a part of each of the SiGe buffer layer 103, the n-type heavily doped layer 104, the spacer layer 105, the n-channel layer 106, the p-channel layer 107, and the Si cap layer 108 which are positioned on both side of the gate electrode 118, whereby the source region 115 and drain region 116 of the p-HMOS are formed. In the SiGe relaxed buffer layer 102, the Ge composition ratio has been increased stepwise from 0 to 10% to provide a crystal surface having a lattice constant higher than the lattice constant of monocrystalline Si in the Si substrate 101. The SiGe buffer layer 103 is provided in order to prevent a crystal defect produced in the SiGe relaxed buffer layer 102 from affecting the channel layers 106 and 107. The n-type heavily doped layer 104 is for supplying carriers to the n-channel layer 106. The spacer layer 105 is provided to spatially separate the n-type heavily doped layer 104 from the n-channel layer 106 with the view to preventing the ionized impurity in the n-type heavily doped layer 104 from entering the n-channel layer 106 and scattering the carriers. Either of the SiGe buffer layer 103 and the spacer layer 105 is composed of SiGe having a Ge composition ratio of 10%. On the other hand, the n-type heavily doped layer 104 is composed of SiGe having a Ge composition ratio of 20%.

The n-channel layer 106 is a layer of the n-HMOS in which electrons travel, while the p-channel layer 107 is a layer of the p-HMOS in which carriers travel. The Si cap layer 108 is provided to form the p-channel layer 107 using a hetero-interface even on the upper end of the SiGe layer.

Figure 17A:
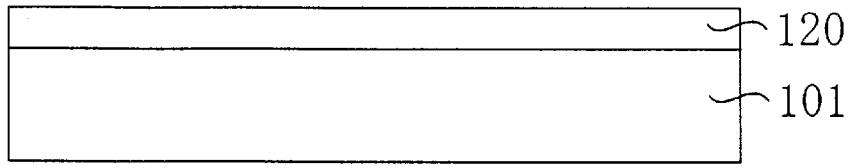
FIGS. 17(a) to 17(c) are cross-sectional views showing apart of the process of fabricating the HCMOS device in the embodiment of the present invention.
Figure 17B:
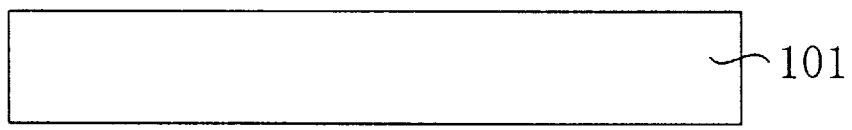
Figure 17C:
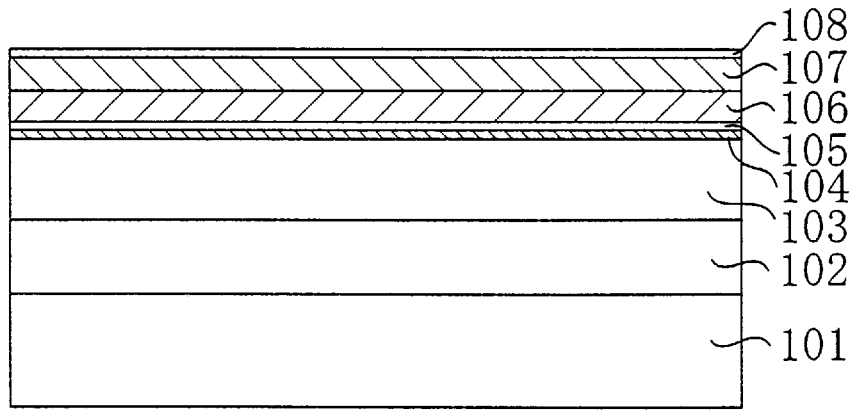

FIGS. 17(a) to 17(c) are cross-sectional views showing a part of the process of fabricating the HCMOS device in the present embodiment.

In the step shown in FIG. 17(a), a cleaning process such as a RCA process is performed with respect to the Si substrate 101 formed with an n-well and a p-well (either of which is not shown) to remove an impurity on a surface of the Si substrate 101. The Si substrate 101 is then loaded in the crystal growing apparatus. At this time, a chemical oxide 120 having a thickness of about 15 Å has been formed on a main surface of the Si substrate 101.

Next, in the step shown in FIG. 17(b), the substrate is placed in a vacuum vessel through a load-lock chamber such that the chemical oxide 120 is removed therefrom in the vacuum chamber. The removal of the chemical oxide 120 is performed by using $Si_2H_6$ or the like, while heating the substrate, in the vacuum vessel shown in FIG. 1, which will be described later. The removal process will be described in greater detail later.

Next, in the step shown in FIG. 17(c), a SiGe layer and a Si layer are epitaxially grown on the Si substrate 101.

If a source gas is introduced into the crystal growing apparatus during the epitaxial growth, a silicon hydride such as silane ($SiH_4$) or disilane ($Si_2H_6$) can be used as a Si source gas and germane ($GeH_4$) can be used as a Ge source gas.

First, the SiGe relaxed buffer layer 102 is grown on the Si substrate 101. This is for obtaining a SiGe layer with a relaxed lattice and a mixed crystal layer in which the Ge composition ratio is increased stepwise (e.g., by 5% at a time) is grown. The total film thickness of the SiGe relaxed buffer layer 102 is about 1 μm. Then, the SiGe buffer layer 103 having a Ge composition ratio of 10% and a single composition is grown on the SiGe buffer layer 102. The thickness of the SiGe buffer layer 103 is appropriately in the range of about 30 to 50 nm. Then, the n-type heavily doped layer 104 having a Ge composition ratio of 20% is grown on the SiGe buffer layer 103. Doping for the growth of the n-type heavily doped layer 104 is conducted by introducing a dopant gas containing an impurity into the crystal growing apparatus in addition to the Si source and the Ge source. After the growth of the n-type heavily doped layer 104, the supply of $PH_3$ is halted by the time at which the growth of the spacer layer 105 is initiated so that the spacer layer having a Ge composition ratio of 10% and a thickness of about 1 to 2 nm is grown. The composition of the spacer layer 105 is $Si_{0.7}Ge_{0.3}$ so that the Ge composition ratio of the spacer layer 105 is lower than the Ge composition ratio of the n-type heavily doped layer 104.

Next, the n-channel layer 106 made of Si is grown on the spacer layer 105 and the p-channel layer 107 made of SiGe is grown on the n-channel layer 106. Next, the Si cap layer 108 is grown on the p-channel layer 107, whereby the process of epitaxial growth is completed. The Si cap layer 108 grown finally is for forming a hetero-interface between itself and the underlying p-channel layer 107 made of SiGe but the Si cap layer 108 is also used to form a Si oxide film as a gate insulating film by thermal oxidation. A sufficient thickness of the Si cap layer 108 is such that the Si cap layer 108 after the gate oxidation has a thickness of about 1 nm.

After the completion of the foregoing process of epitaxial growth, the HCMOS can be fabricated by performing substantially the same procedure as a normal SiCMOS process. Specifically, the gate insulating film 109 is formed by oxidizing a surface (surface of the Si cap layer 108) of the substrate after the completion of the epitaxial growth and a polysilicon film is deposited on the substrate and patterned to form the gate electrodes 113 and 118. Thereafter, ions of an n-type impurity (phosphorus) are implanted into the substrate by using the resist film covering the p-HMOS formation region and the gate electrode 113 as a mask, whereby the source region 110 and drain region 111 of the n-HMOS are formed. Further, ions of p-type impurity (boron) are implanted into the substrate by using the resist film covering the n-HMOS formation region and the gate electrode 118 as a mask, whereby the source region 115 and drain region 116 of the p-HMOS are formed.

By the foregoing process, the structure of the HCMOS device shown in FIG. 16 can be obtained easily.

Apparatus

A description will be given next to a method of dynamically observing the process of removing a protective oxide film on the Si substrate therefrom in the apparatus for epitaxial crystal growth. The apparatus for epitaxial crystal growth is provided with an additional spectroscopic ellipsometric measuring apparatus for in-situ observation, which is for the analysis of polarized light.

Figure 1:
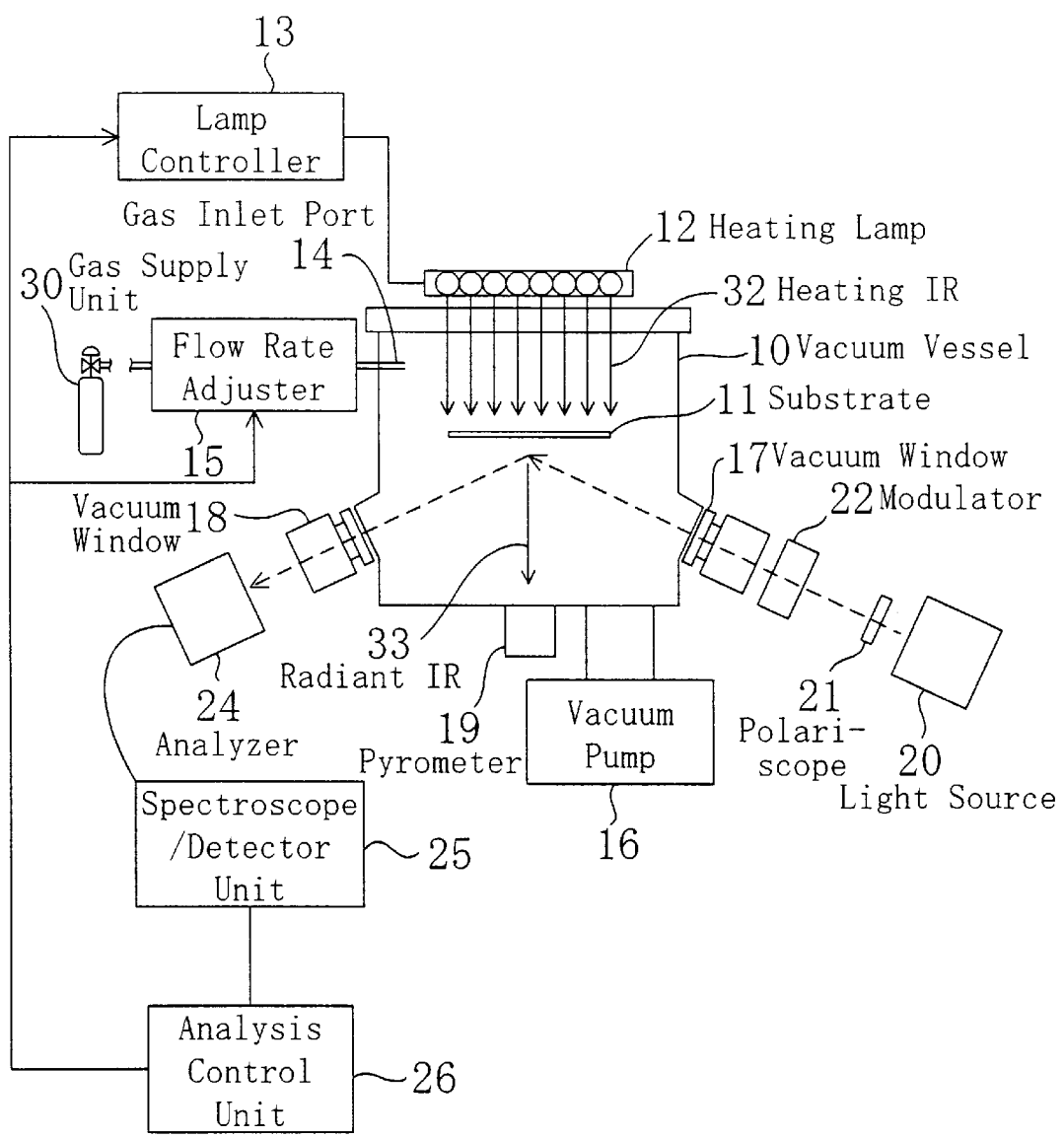
FIG. 1 is a cross-sectional view partially showing a structure of a crystal growing apparatus provided with an additional spectroscopic ellipsometric apparatus used in an experiment conducted in an embodiment of the present invention.

FIG. 1 is a partial cross-sectional view of a structure of the crystal growing apparatus by UHV-CVD provided with the additional spectroscopic ellipsometric measuring apparatus used in an experiment conducted in the present embodiment. As stated previously, the present embodiment uses the crystal growing apparatus in the step shown in FIG. 17(b).

As shown in FIG. 1, the crystal growing apparatus comprises: a vacuum vessel 10 for accommodating therein the substrate 10 composed of the Si substrate having a chemical oxide (oxide film) formed thereon such that the oxide film is removed and a crystal is grown epitaxially; a heating lamp 12 for heating the substrate 11; a lamp controller 13 for controlling the heating lamp 12 to adjust the temperature of the substrate; a gas inlet port 14 for introducing a gas into the vacuum vessel 10; a flow rate adjuster 15 for adjusting the flow rate of the gas; a vacuum pump 16; and a pyrometer 19 for measuring the substrate temperature. The flow rate adjuster 15 is disposed to intervene a pipe for providing a connection between the vacuum vessel 10 and a gas supply unit 30 for supplying a $Si_2H_6$ gas or the like to the vacuum vessel 10.

The spectroscopic ellipsometric measuring apparatus comprises: a light source 20; a polariscope 21 for adjusting the state of polarization of incident light; a modulator 22 for imparting modulation to the incident light; an analyzer 24 for receiving reflected light from the surface of the substrate 11 as an object of measurement on which the oxide film has been formed; a spectroscope/detector unit 25 for splitting the reflected light and measuring the intensities of signals; and an analysis control unit 26 for calculating $\Psi$, $\Delta$ as the fundamental measurement quantities for ellipsometric measurement from the signals measured by the detector unit 15, sensing conditions, and then transmitting a control signal to each of the units.

The spectroscopic ellipsometric measuring apparatus also comprises: a vacuum window 17 for introducing incident light 30 into the vacuum vessel; and a vacuum window 18 for retrieving reflected light 31 from the vacuum vessel 10. As the vacuum windows 17 and 18, low-distortion vacuum windows which are commercially available for ellipsometric measurement are used preferably.

Since the present embodiment has used the spectroscopic ellipsometric measuring apparatus capable of performing measurement at a plurality of wavelengths, the light source 20 used therein generates light with a wide wavelength spectrum and the spectroscope/detector unit 26 used therein has a spectroscopic function. However, the present invention can also use an ellipsometric measurement apparatus involving the use of only a single wavelength. In that case, it becomes possible to use the light source 20 and the spectroscope/detector unit 26 which are compatible with a single wavelength, so that the structure of the apparatus is simplified.

As described above, the (spectroscopic) ellipsometric measuring apparatus is an evaluation apparatus which illuminates an object of measurement with linearly polarized light and obtains a variety of data, including the thickness and composition of a thin film and the planarities of a surface and an interface, from a change in the polarized state of light reflected by the object of measurement. The ellipsometric measuring apparatus is characterized in that measurement can be performed without destroying a sample and with high accuracy since light is barely absorbed even in a reactive gas atmosphere.

Although the present invention has used the ellipsometric measuring apparatus to control the step of removing the oxide film, the ellipsometric measuring apparatus has a high utility value in the process of fabricating a semiconductor device since it can also be used for the evaluation of the thickness and composition of a crystal thin film which is grown after the removal of the oxide film.

Process of Removing Oxide Film

Figure 2A:
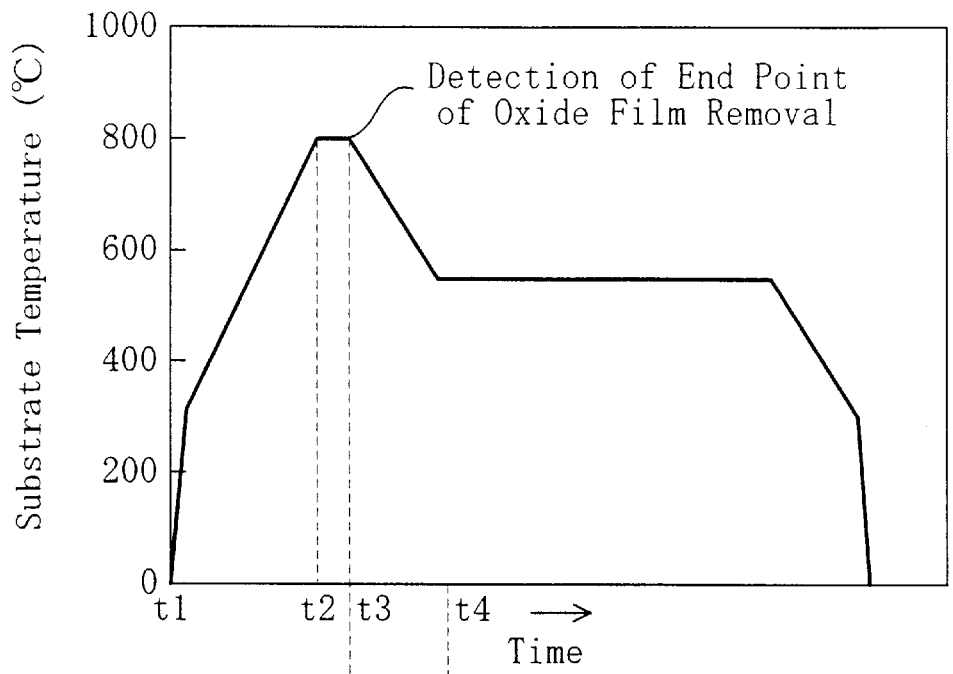
FIGS. 2(a) to 2(c) are views illustrating process steps of etching a chemical oxide film as a protective oxide film.
Figure 2B:
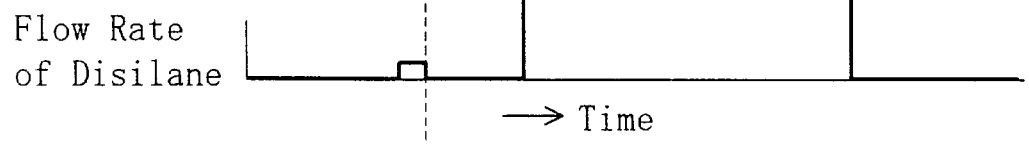
Figure 2C:
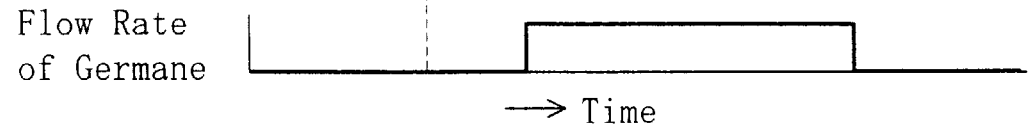

FIGS. 2(a) to 2(c) illustrate the process steps of etching a chemical oxide film as a protective oxide film, of which FIG. 2(a) shows the temperature of a substrate varying with time, and FIG. 2(b) shows the low rate of disilane varying with time, and FIG. 2(c) shows the flow rate of germane varying with time. A description will be given to the fundamental process of removing the oxide film.

First, the substrates cleaned with a solution mixture of sulfuric acid and hydrogen peroxide such that metal and organic impurities are removed therefrom. Then, the solution agent is sufficiently removed by rinsing the substrate with water. Thereafter, surface impurities are removed with a solution agent containing ammonia and peroxide and the substrate is rinsed with water.

Since the cleaning process is an item irrelevant to the present invention, it may be replaced by a process using another solution agent such as one containing an organic component or nitric acid as listed in the paper written by Ishizaka et al.

Since an oxide film may have been formed on the surface of the substrate at the stage at which cleaning is completed, the substrate is temporarily immersed in dilute hydrofluoric acid of about 30% such that the oxide film on the surface is completely removed therefrom and that a uniform protective oxide film is formed. After the treatment with hydrofluoric acid, the wafer is lightly rinsed with pure water for the checking of the water repellency of the surface of the wafer. If the wafer does not exhibit sufficient water repellency, the treatment with hydrofluoric acid and the rinsing with water are repeated since there is the possibility that the oxide film is remaining. After the rinsing with pure water is completed, the wafer exhibiting water repellency is subjected to chemical treatment, whereby the protective oxide film is formed.

As representatives of the agent usable for the formation of the protective oxide film, there are an aqueous solution agent containing ammonia and hydrogen peroxide and a solution agent containing hydrochloric acid and hydrogen peroxide. However, since a defect is more likely to occur in a crystal layer grown after the treatment using the latter solution agent, an excellent crystal is more likely to grow with the use of the aqueous solution agent containing ammonia and hydrogen peroxide.

As the solution agent, there can be used a mixture of ammonia, hydrogen peroxide, and pure water at a volume ratio of 1:6:20, as stated previously. By immersing the substrate in the solution agent (about 70° C.) for about 1 minute, an oxide film with a thickness of about 15 to 20 Å is formed on the surface of the substrate.

The surface of the wafer formed with the protective oxide film is rinsed with pure water such that the solution agent does not remain thereon. After the wafer is dried with nitrogen or the like, it is transported to the crystal growing apparatus and loaded therein.

To hold an ultra-high vacuum state in a crystal growing chamber, the substrate is temporarily inserted in a load-lock chamber. After the degree of vacuum is increased from an atmospheric pressure to about $3 \times 10^{-7}$ Torr (about 0.04 mPa), the substrate is transported from the load-lock chamber to the crystal growing chamber.

At the time point (e.g., timing t1) at which the degree of vacuum in the crystal growing chamber is increased to about $10^{-10}$ Torr (about $1.33 \times 10^{-5}$ mPa), a heating process is initiated. Since the substrate temperature is measured by using a pyrometer usable in the temperature range of 300° C. or more in the apparatus employed in the present embodiment, the substrate is heated rapidly to 300° C. in about 2 minutes.

Next, the heating of the substrate is initiated to increase the substrate temperature to about 800° C. In this experiment, the substrate temperature has been heated rapidly to 800° C. to clarify a physical phenomenon in the process of removing the oxide film. However, if the temperature is increased excessively rapidly at this stage during the fabrication of an actual device, a thermal distortion may occur in the substrate to cause a slip line. Accordingly, a temperature increase rate is preferably suppressed to about 20 to 50° C./min.

Next, the description will be given to the step of removing the protective oxide film. Although the protective oxide film can be removed if the temperature is about 710° C. or more, a longer time is required for the removal as the temperature is lower, while device properties may be degraded by a variation in impurity profile or the like as the temperature Is higher. Therefore, the present embodiment performs the removal at 800° C. Since the present embodiment removes the oxide film in a short period of time, the introduction of disilane ($Si_2H_6$) at 1 sccm into the crystal growing apparatus is initiated at the point at which the temperature has reached 800° C. (timing t2).

As described above, since the signals obtained by (spectroscopic) ellipsometry are varied not only by the removal of the oxide film but also by a variation in the substrate temperature, signal variations associated with the completion of the removal of the oxide film can be detected more easily if the substrate temperature is held constant before and after the completion. Therefore, the present embodiment holds the substrate temperature at 800° C. till the removal of the oxide film is completed. However, it is possible to detect the point at which the oxide film is removed even during the period during which the temperature is varying if the signal variations are analyzed in consideration of the variation in the substrate temperature. Since $\Psi$, $\Delta$ vary as the oxide film is removed and the variations in $\Psi$, $\Delta$, especially the variation in $\Delta$, are rapidly loosened, the point at which the removal of the oxide film is completed (timing t3) is detected by spectroscopic ellipsometry based on the variation.

At the point at which the removal of the oxide film is sensed by ellipsometry, a control signal is transmitted to the lamp controller 13 and to the flow rate adjuster 15 such that the cooling of the substrate to a temperature suitable for crystal growth is initiated and the supply of disilane that has been introduced into the vacuum vessel for the removal of the oxide film is halted. The control operation can also be performed mechanically automatically. Instead of performing the automatic control operation, a human being may also make a judgment and change the settings of the lamp controller and the flow rate adjuster based on the result of spectroscopic ellipsometric measurement.

At the point at which a temperature (about 450° C. to 600° C.) suitable for crystal growth is reached, a source gas for crystal growth ($SiH_4$ or $Si_2H_6$ in the case of growing Si or $GeH_4$ in addition to the Si source in the case of growing SiGe) is supplied to the vacuum vessel 100.

Observation for Analysis of Reaction for Removing Oxide Film

FIG. 3 is a view showing variations in signals $\Delta$ (Delta), $\Psi$ (Psi) obtained as a result of in-situ ellipsometric observation made in removing an oxide film by heating the oxide film to 800° C. in a vacuum atmosphere. In the drawing, the horizontal axis represents time (sec) and the vertical axis represents $\Delta$ or $\Psi$ (degree). The oxide film (chemical oxide) used in the measurement was formed by cleaning a Si substrate with a solution mixture of sulfuric acid and hydrogen peroxide and with a solution mixture of ammonia and hydrogen peroxide, temporarily removing the oxide film on the surface therefrom by hydrofluoric acid treatment, and then treating the substrate for 1 minute with an aqueous solution mixture of ammonia and hydrogen peroxide (ammonia:hydrogen peroxide:pure water=1:6:20) at 70° C. The thickness of the oxide film measured by spectroscopic ellipsometry immediately after the substrate was introduced into the crystal growing apparatus was about 16 Å.

In the experiment, the substrate temperature was increased rapidly to 800° C. by initially heating the substrate for about 150 sec, holding the substrate temperature at 800° C. for 30 minutes, and then cooling the substrate to a room temperature. The signal variations observed before about 2.5 minutes (150 sec) elapsed from the initiation of the heating and the signal variations observed after about 34 minutes (about 2000 sec) elapsed from the initiation of the heating are associated with the variations in the substrate temperature and irrelevant to the removal of the oxide film. That is, $\Delta$ (Delta) and $\Psi$ (Psi) vary even with respect to the same sample if the temperature varies so that the substrate temperature is preferably constant during the observation made by spectroscopic ellipsometry.

Of 30 minutes (1800 sec) during which the substrate temperature was held constant at 800° C., each of $\Delta$ (Delta) and $\Psi$ (Psi) increased gradually as the reaction for removing the oxide film proceeds only for the first period of about 7 minutes (420 sec). From the instant at which 11 minutes (660 sec) elapsed and the removal of the oxide film was assumed to be complete and on, each of $\Delta$ (Delta) and $\Psi$ (Psi) had a constant value.

Figure 4:
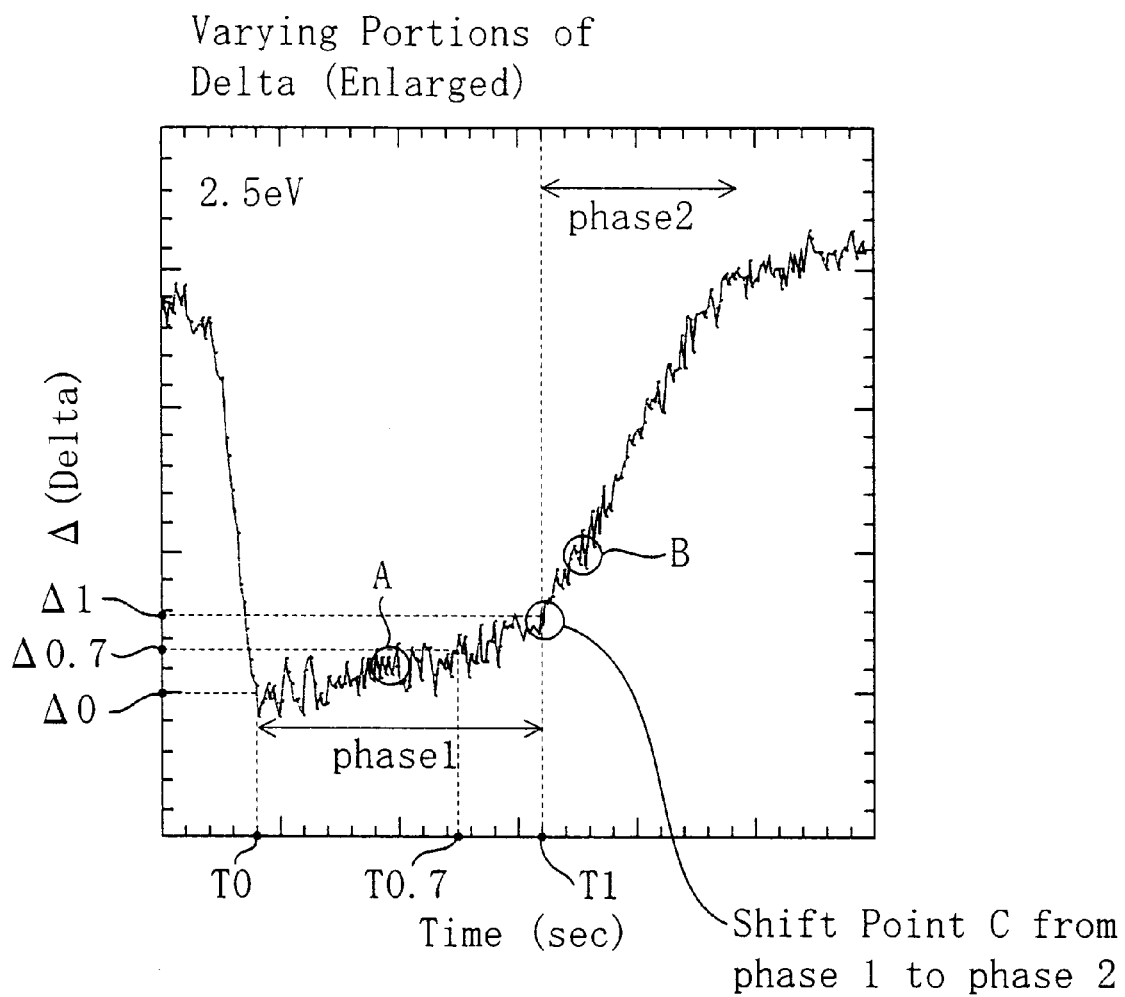
FIG. 4 is a view showing under magnification variations in Δ (Delta) during the period during which a reaction for removing the oxide film in FIG. 3 proceeds.

FIG. 4 is a view showing the variations in $\Delta$ (Delta) under magnification while the reaction for removing the oxide film in FIG. 3 proceeds. As is obvious from the drawing, $\Delta$ increased only mildly during the first period of the reaction for removing the oxide film but increased sharply from the certain time point T1 and thereafter. It is assumed here that the first-half portion in which $\Delta$ increased mildly is termed phase 1 and the second-half portion in which $\Delta$ increased sharply is termed phase 2.

Physical Significance of Phase 1 and Phase 2

Figure 5:
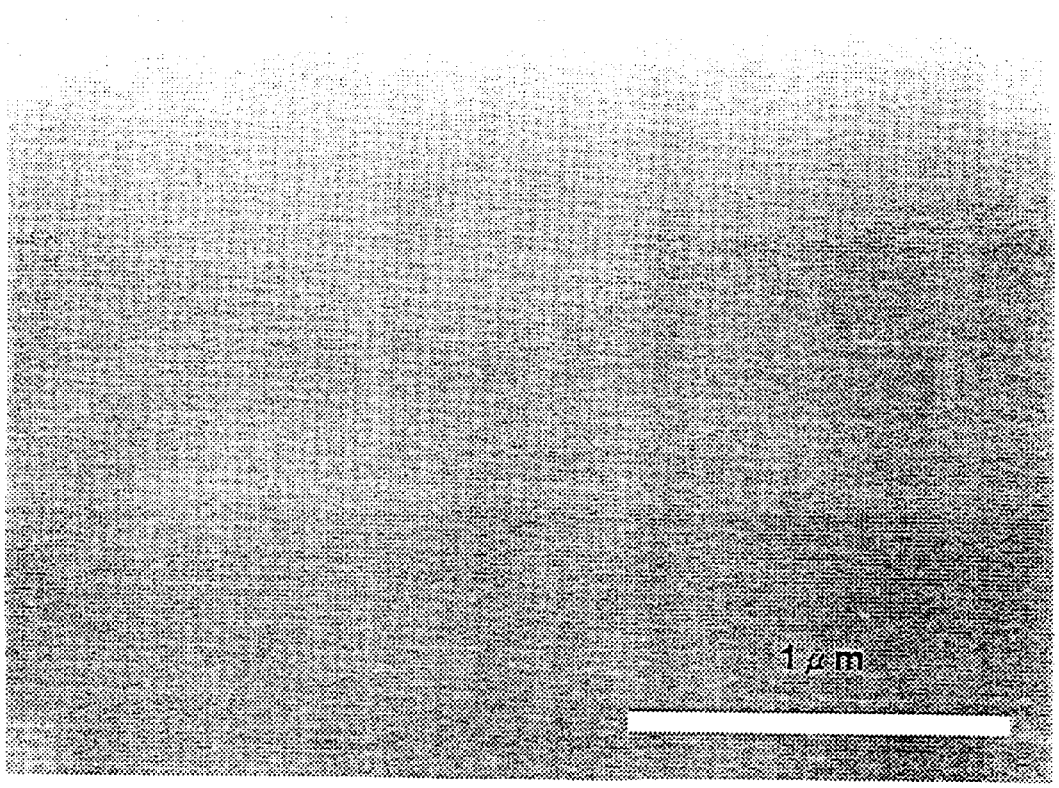
FIG. 5 is an electron micrograph of a surface of a substrate at the point A in phase 1 shown in FIG. 4.
Figure 6:
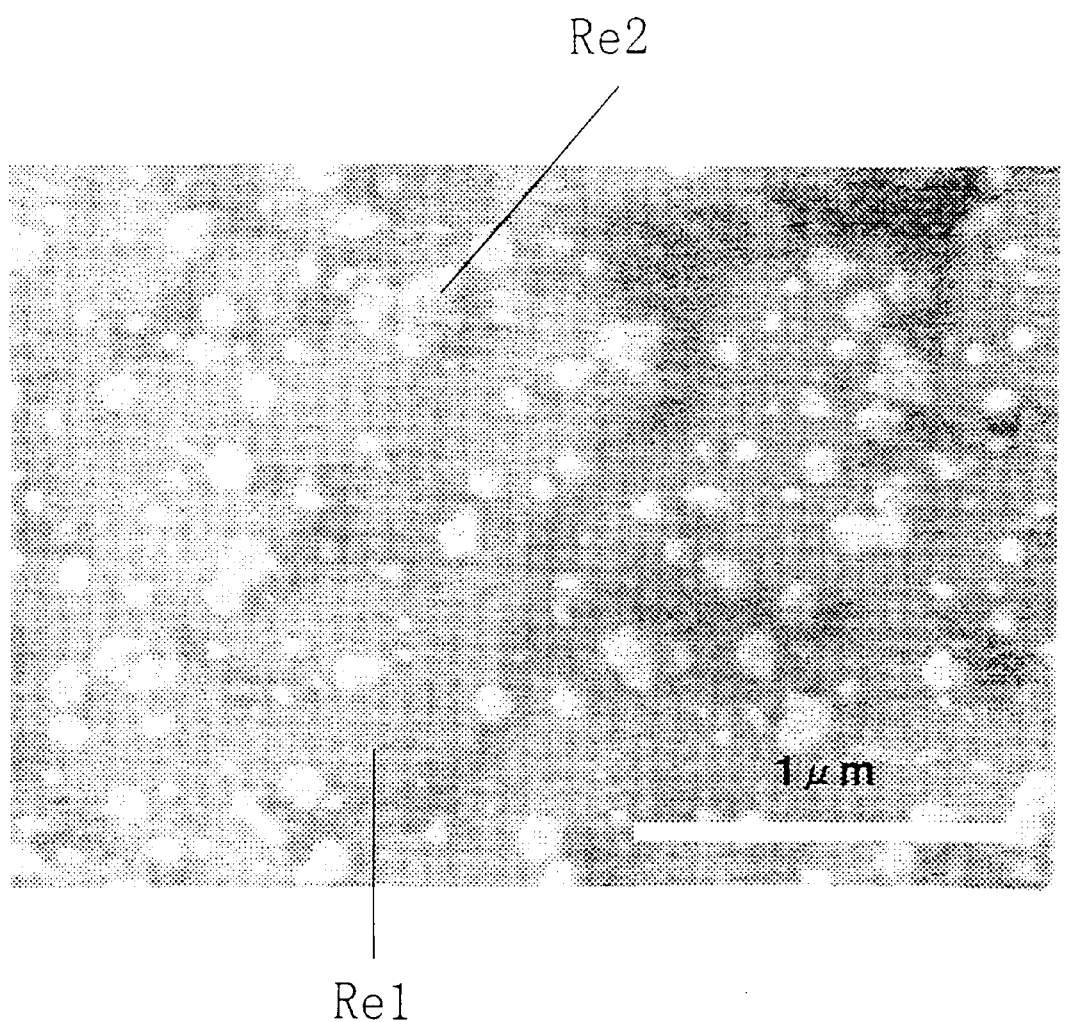
FIG. 6 is an electron micrograph of the surface of the substrate at the point B in phase 2 shown in FIG. 4.

FIGS. 5 and 6 are micrographs obtained as a result of interrupting the removal of the oxide film at the respective points A, B of phases 1, 2, retrieving the substrate 11 from the crystal growing apparatus, and photographing the surface of the substrate 11 by using an electron microscope. Since the object of observation is an extremely thin oxide film, a SiGe crystal was grown only on the portion at which the oxide film was lost and the clean silicon surface is exposed for easier observation, whereby the micrograph shown in FIG. 5 was obtained.

As can be seen from FIG. 5, the entire surface of the underlying silicon substrate 11 was still covered with the oxide film after the step of removing the oxide was interrupted midway in phase 1. By contrast, as shown in FIG. 6, the region Re1 in which the oxide film remains and the region Re2 in which a SiGe crystal layer was grown on the portion at which the oxide film was partially lost and the clean Si substrate was exposed are present in the substrate 11 after the step of removing the oxide film was interrupted midway in phase 2. This indicates that the region Re2 formed with the SiGe layer corresponds to a hole from which the oxide film has been partially removed in the actual fabrication process.

Thus, it has been proved that the protective oxide film is lost by the heating treatment in the crystal growing apparatus not in such a manner that the thickness of the protective oxide film is reduced gradually uniformly but in such a manner that a hole is formed in a part of the protective oxide film, the underlying clean silicon surface is exposed therein, and the hole is gradually enlarged.

In accordance with the conventional method for observation using RHEED, it is difficult to detect such a shift from phase 1 to phase 2 in the process of removing the oxide film.

By making in-situ ellipsometric observation, however, the present invention enables the detection of the shift from phase 1 to phase 2 based on a variation in the increase rate of $\Delta$, as shown in FIG. 4.

Lowering of Reaction Temperature by Using $Si_2H_6$ an experiment was conducted in which an oxide film (chemical oxide) was removed in a $Si_2H_6$ atmosphere from a substrate similar to the substrate 11 used in the foregoing embodiment.

Figure 7:
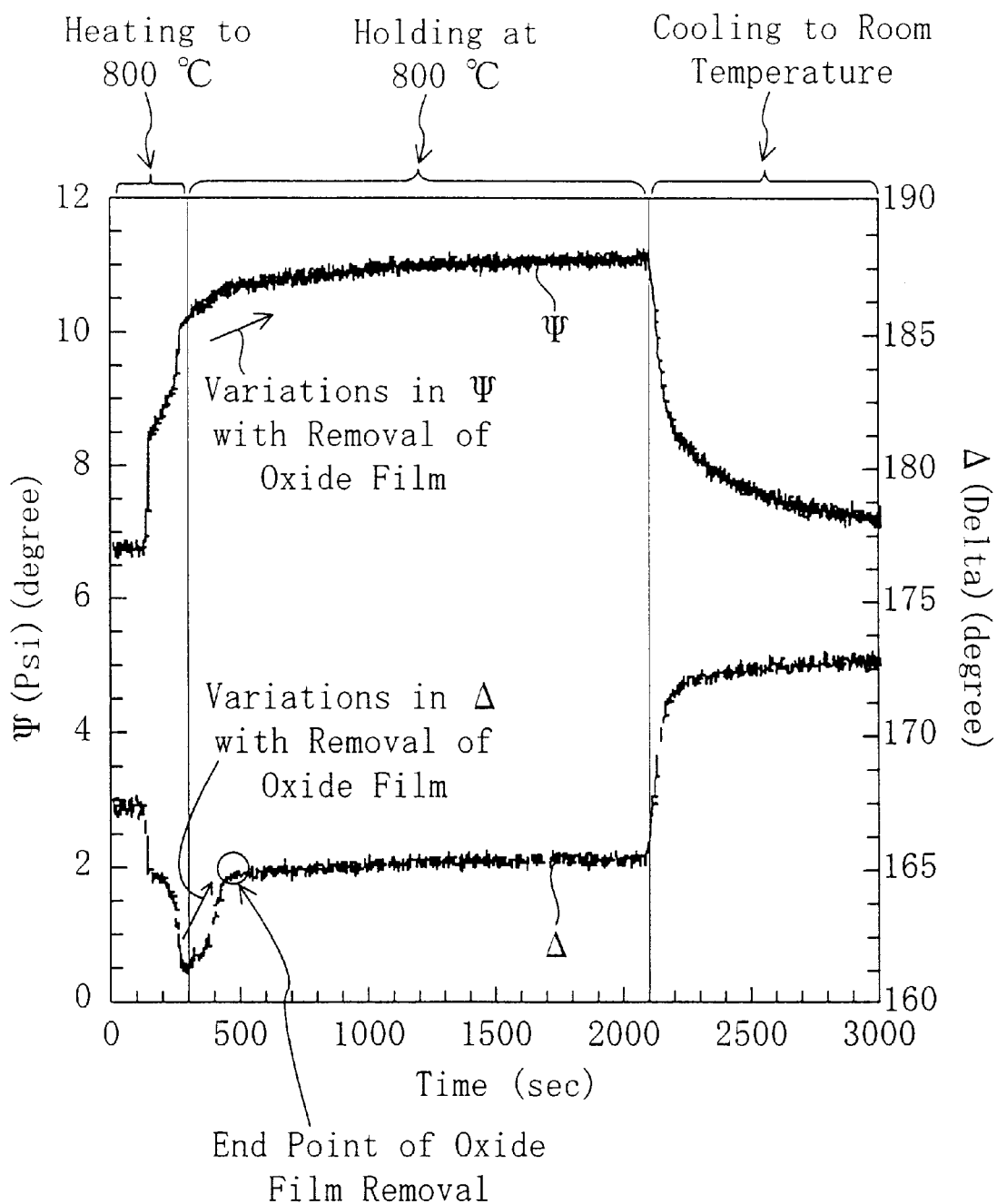
FIG. 7 is a view showing variations in Δ, Ψ when $Si_2H_6$ is introduced into the crystal growing apparatus at a flow rate of 1 sccm for 15 minutes in the process of removing an oxide film.

FIG. 7 is a view showing variations in $\Delta$ and $\Psi$ when $Si_2H_6$ is introduced into the crystal growing apparatus at a flow rate of 1 sccm for 15 minutes in the process of removing an oxide film. In the drawing, the horizontal axis represents a time (sec) and the vertical axis represents $\Delta$ or $\Psi$ (degree). As can be seen from the drawing, each of $\Delta$, $\Psi$ increased during the reaction for removing the oxide film and had a nearly constant value even in the case of removing the oxide film by allowing $Si_2H_6$ to flow, similarly to the case of removing the oxide film under vacuum shown in FIG. 3. It can also be seen that $\Delta$ had its increase rate changed in two steps during the reaction for removal. In addition, the time required to complete the removal of the oxide film was obviously reduced compared with the time required to complete the removal of the oxide film under vacuum.

Wavelength and Sensitivity of Measuring Light for Spectroscopic Ellipsometry

Figure 8:
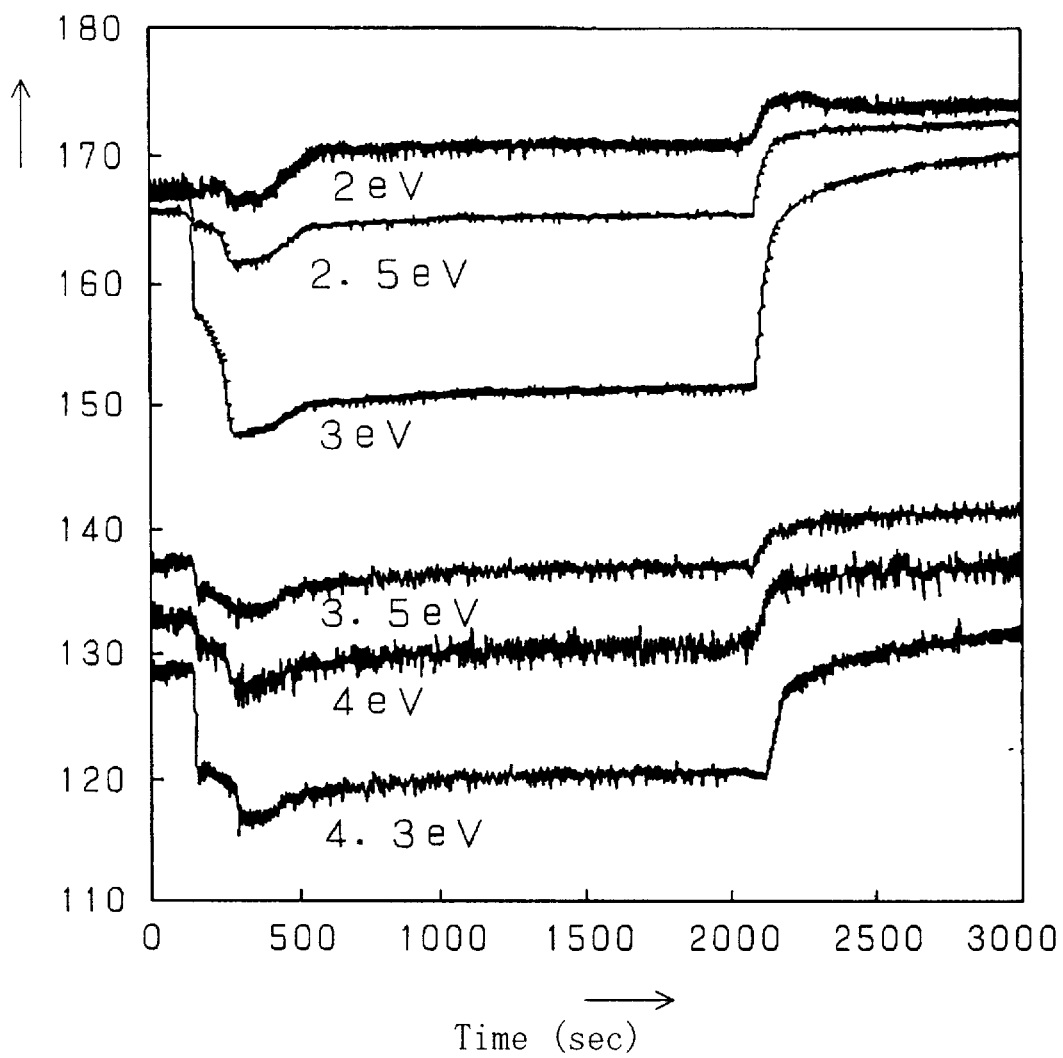
FIG. 8 is a view showing representatives of the results of measuring Ψ, Δ with a plurality of energies in the experiment shown in FIG. 5.

FIG. 8 is a view showing the representatives of the results of simultaneously measuring $\Psi$, $\Delta$ with a plurality of energies in the experiment shown in FIG. 3.

Although a signal variation associated with the removal of the oxide film is observed with each of the energies shown in FIG. 8, the variation is milder in the case of using the energy not less than 3.5 eV. Therefore, it will be understood that the use of energy not more than 3 eV makes it easier to detect the completion of the removal of the oxide film.

Dependence of Reaction for Removing Oxide film on Temperature

Next, the respective times required by phases 1 and 2 to remove an oxide film were measured by varying a heating temperature in removing the oxide film in each of a vacuum atmosphere and a $Si_2H_6$ atmosphere.

Figure 9:
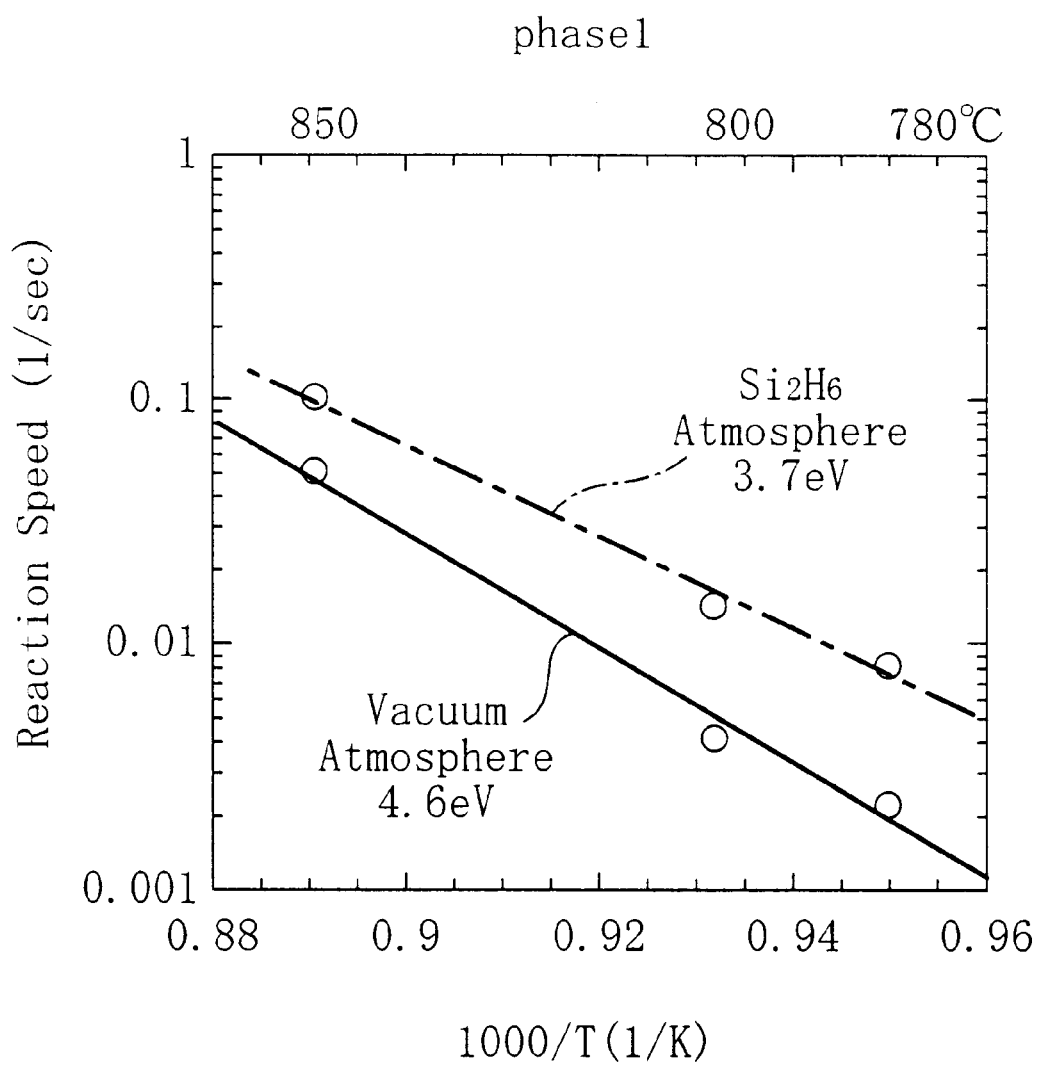
FIG. 9 is a view showing the dependence on time of a reaction speed obtained by experiment in phase 1 during the removal of an oxide film.
Figure 10:
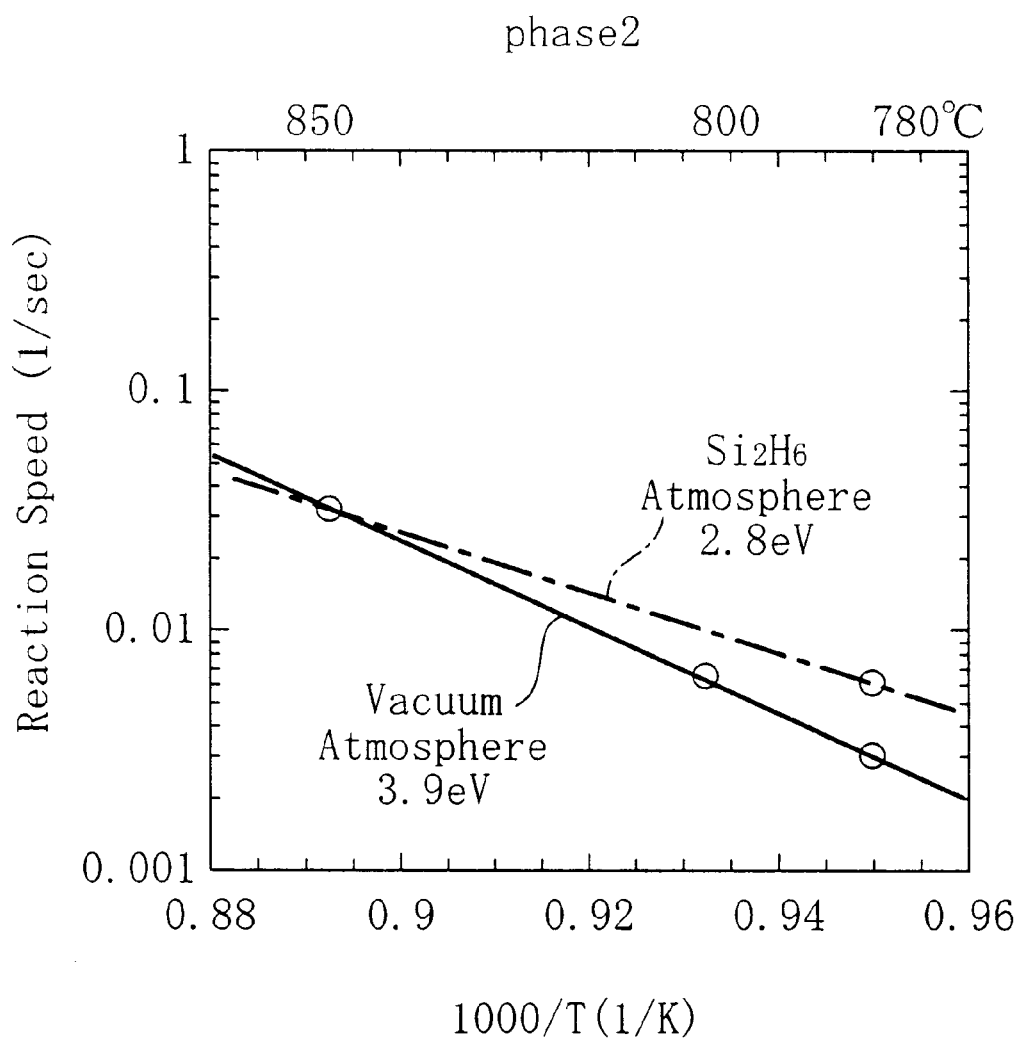
FIG. 10 is a view showing the dependence on time of a reaction speed obtained by experiment in phase 2 during the removal of an oxide film.

FIG. 9 is a view showing the dependence of a reaction speed on time in phase 1 for removing the oxide film. FIG. 10 is a view showing data on the dependence of a reaction speed on time in phase 2 for removing the oxide film. In each of FIGS. 9 and 10, the horizontal axis represents the reciprocal of the substrate temperature and the vertical axis represents the reaction speed as the reciprocal of the period required by phase 1 or phase 2. As is obvious from the drawings, the reaction is a so-called thermal excitation process in which the logarithm of the reciprocal of the time required by the reaction is proportional to the reciprocal of the absolute temperature of the substrate.

Activation energy in phase 1 obtainable from FIG. 9 is 4.6 eV in the vacuum atmosphere and 3.7 eV in the $Si_2H_6$ atmosphere. Activation energy in phase 2 obtainable from FIG. 10 is 3.9 eV in the vacuum atmosphere and 2.8 eV in the $Si_2H_6$ atmosphere. This indicates that, in either of phases 1 and 2, the activation energy of the reaction for removing the oxide film was lower when $Si_2H_6$ was used than in the vacuum atmosphere.

Thus, it has been proved that the reaction for removing the oxide film is accelerated in each of phase 1 in which the entire surface of the substrate is covered with the oxide film and phase 2 in which the oxide film is partially lost and the underlying clean silicon surface is exposed by thus introducing a gas containing $Si_2H_6$ or the like containing silicon during the process of removing the oxide film.

As a result of individually measuring activation energy in each of the phases, it becomes possible by using the result to precisely predict the point at which the silicon clean surface begins to be exposed and the point at which the oxide film is lost completely in the process of removing the protective oxide film.

Figure 11:
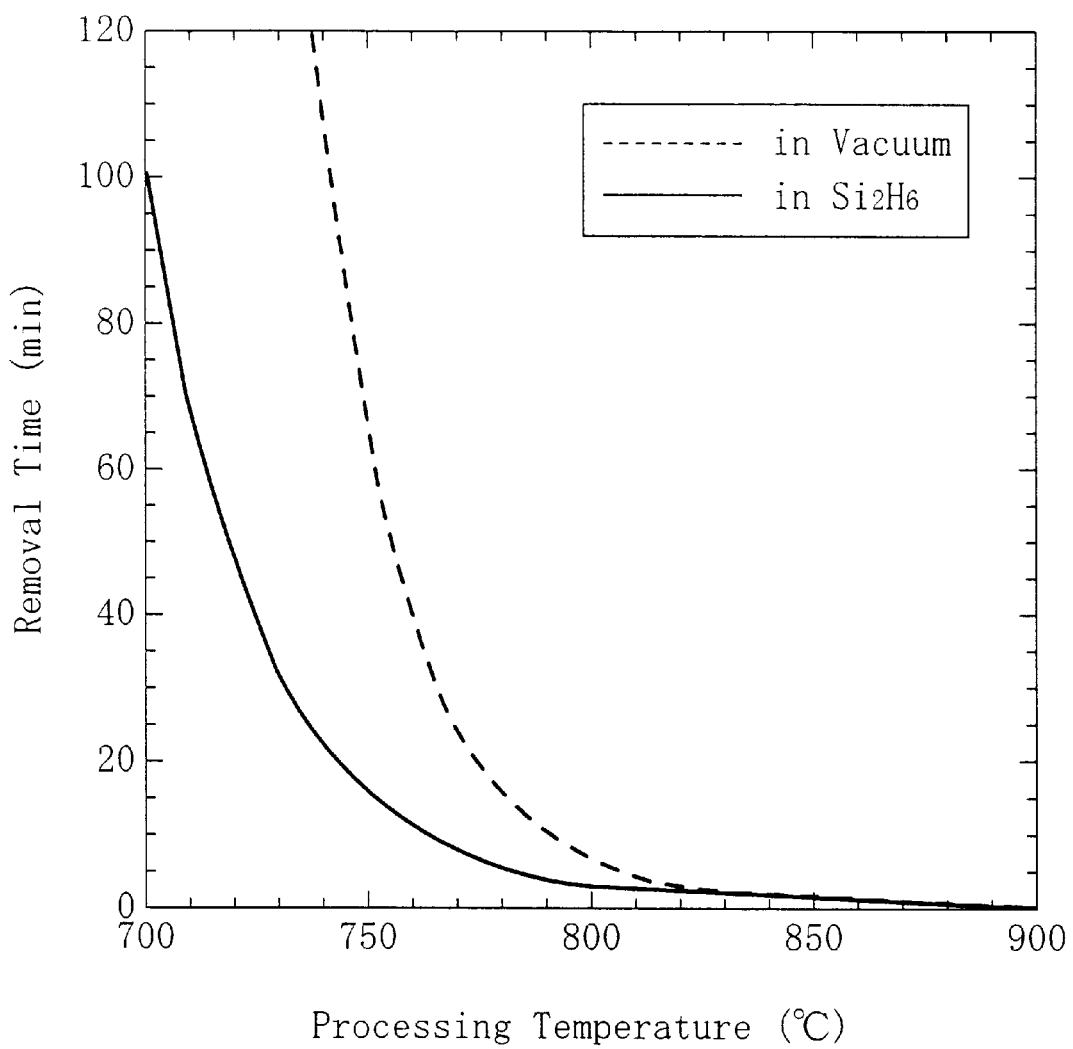
FIG. 11 is a view showing the dependence of a time required to remove an oxide in each of vacuum and $Si_2H_6$ atmospheres, which was obtained by experiment, on the temperature of a substrate.
Figure 12:
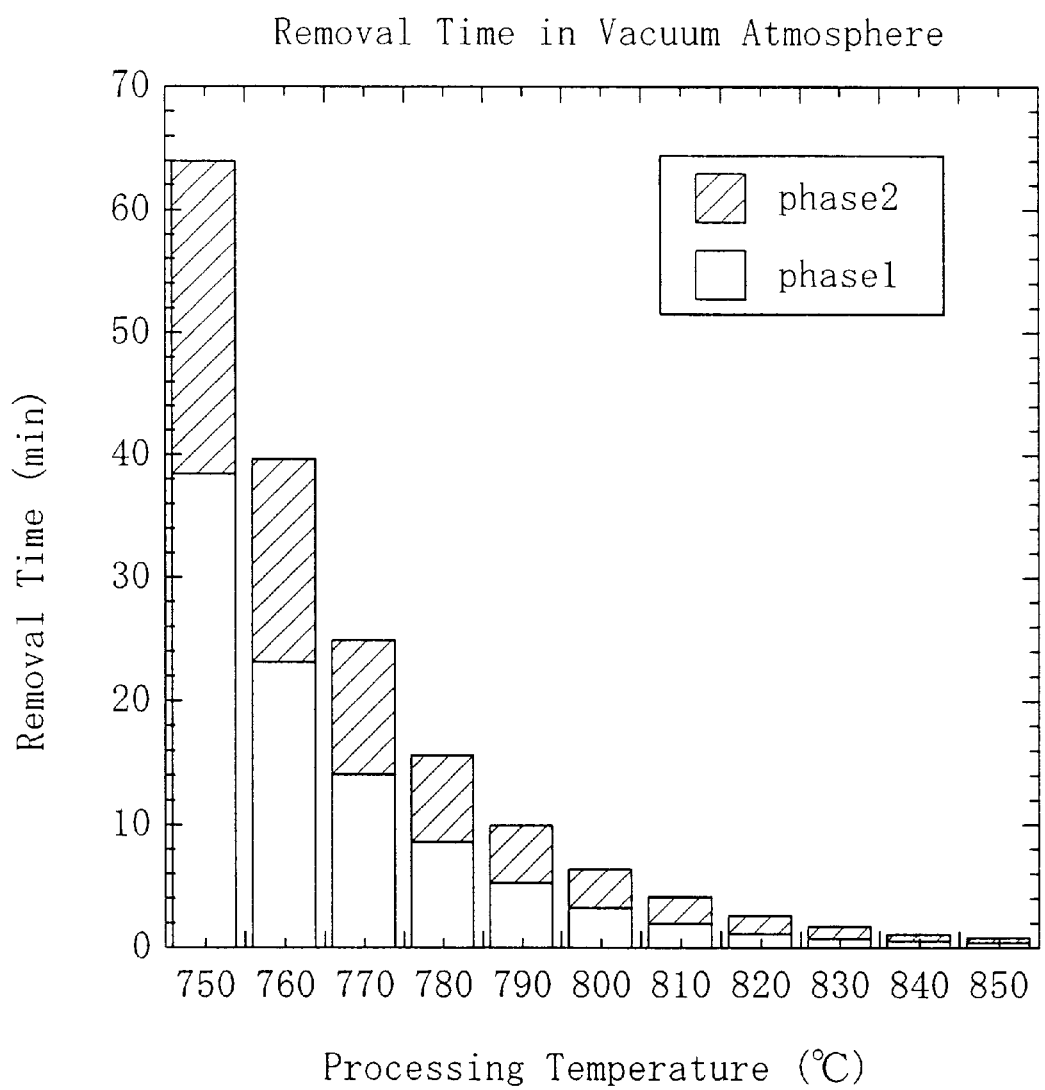
FIG. 12 shows respective times required to remove an oxide film in the vacuum atmosphere in phases 1 and 2, which were obtained by experiment.
Figure 13:
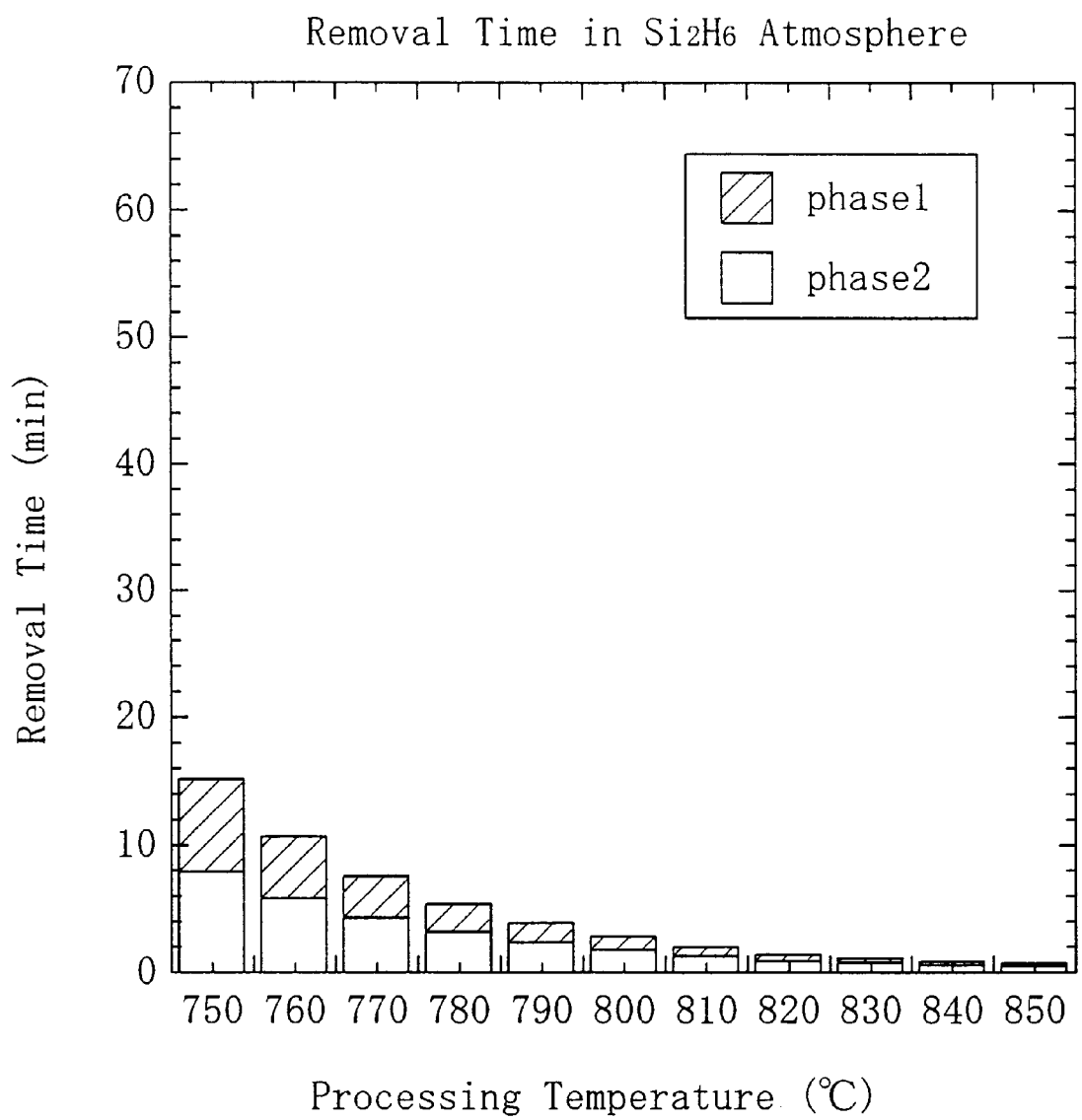
FIG. 13 shows respective times required to remove an oxide film in the $Si_2H_6$ atmosphere in phases 1 and 2, which were obtained by experiment.

FIG. 11 is a view showing the dependence on the substrate temperature of the time required to remove an oxide in vacuum and $Si_2H_6$ atmospheres, which was thus obtained. FIG. 12 shows respective times required to remove an oxide film in the vacuum atmosphere in phases 1 and 2. FIG. 13 shows respective times required to remove an oxide film in the $Si_2H_6$ atmosphere in phases 1 and 2. In FIGS. 11 to 13, the horizontal axis represents the processing temperature and the vertical axis represents the removal time (min).

Model of Reaction for Removing Oxide Film in Phase 1 and Phase 2

Figure 14:
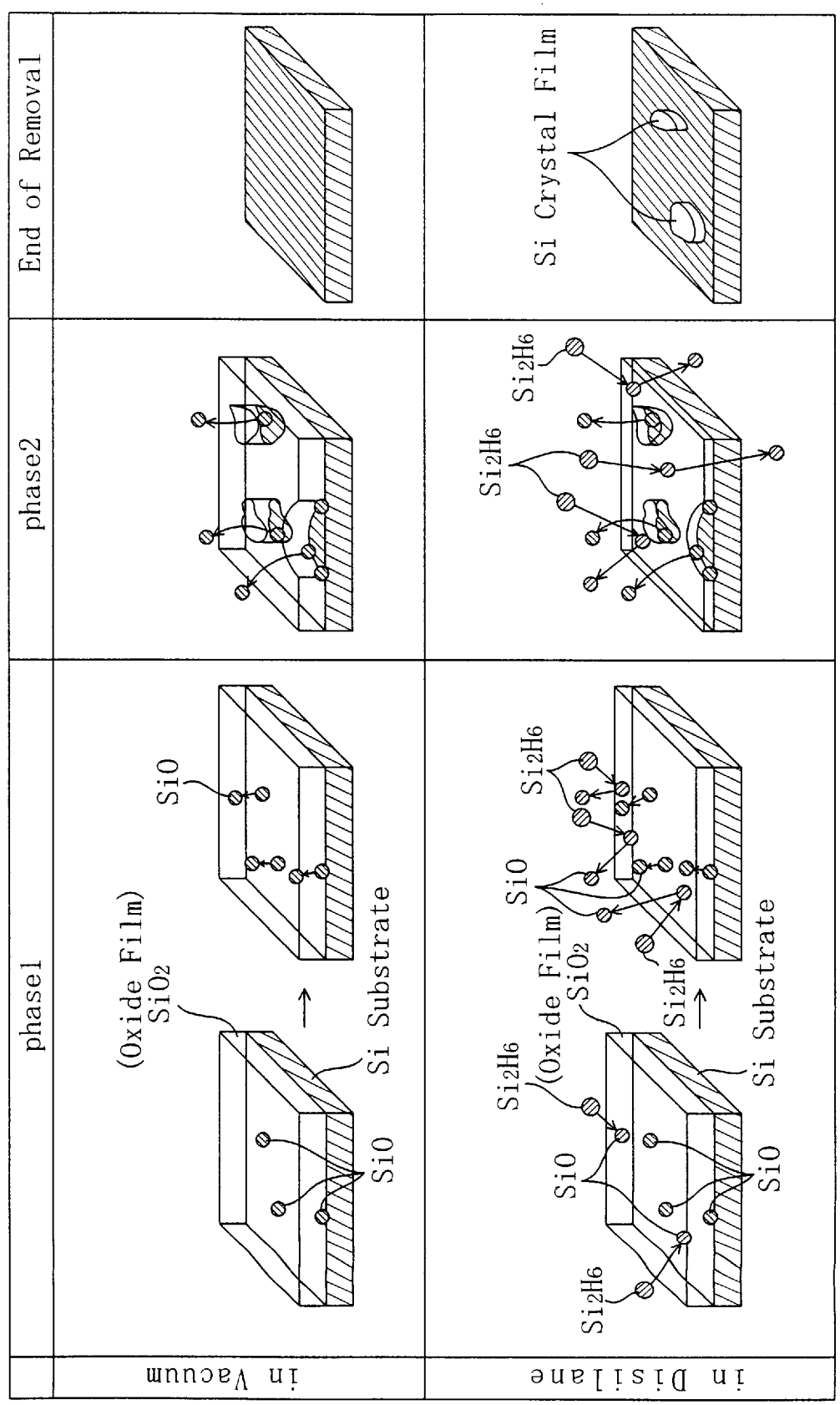
FIG. 14 is a view showing models of a reaction for removing an oxide film in phases 1 and 2 in vacuum and $Si_2H_6$ (disilane) atmospheres.

From all the data and facts obtained from the foregoing experiments, it can be assumed that the reaction for removing the oxide film proceeds by the following mechanism. FIG. 14 is a view showing a model of the reaction for removing the oxide film in phases 1 and 2 in the vacuum atmosphere and in the $Si_2H_6$ (disilane) atmosphere.

In the vacuum atmosphere, Si reacts with $SiO_2$ at the interface between the Si substrate and the oxide film ($SiO_2$) to generate SiO with high volatility. The oxide film is removed through the evaporation of SiO. At this time, since the entire surface of the Si substrate is covered with the oxide film in phase 1, SiO should be diffused in the oxide film and reach the surface of the oxide film in order to evaporate. In other words, the removal of the oxide film requires a long time since it is determined by the speed at which SiO is diffused. However, since the time required by SiO to reach the surface of the oxide film is shorter at a thinned portion of the oxide film, the probability that the once thinned portion is removed preferentially to the other portion thereof is increased. Consequently, the oxide film is removed locally in phase 1 and a hole as shown in FIG. 6 is likely to be formed. Once the hole is formed, SiO is no longer generated at a portion of the bottom of the hole at which the Si substrate is exposed and therefore no more in contact with the oxide film but the Si substrate is in contact with the oxide film at the edge of the bottom of the hole. If SiO is generated at the edge portion, SiO can evaporate directly into vacuum without being diffused in the oxide film. It follows therefore that the removal of the oxide film proceeds far more rapidly if SiO generated at the bottom of the hole evaporates directly than if SiO generated from the reaction between the Si substrate and SiO is diffused in the oxide film. As a result, it can be considered that the process in which the hole is enlarged dominates the process in which the thickness of the oxide film is reduced so that the oxide film is removed.

The present inventors have assumed that the different speeds at which the reaction for removing the oxide film proceeds in phases 1 and 2 shown in FIG. 4 is contributable to the different mechanisms of the reaction for removing the oxide film as described above and proposed a reaction model. According to the reaction model, the period during which the reaction for removing the oxide film proceeds only by the process in which SiO is diffused in the oxide film and evaporates after reaching the surface of the oxide film is assumed to be phase 1 and the period during which the process in which SiO generated at the edge of the bottom of the hole evaporates directly into vacuum proceeds in addition to the foregoing process is assumed to be phase 2.

If $Si_2H_6$ is introduced into the vacuum vessel, on the other hand, $Si_2H_6$ reacts with $SiO_2$ not only at the interface between the Si substrate and the oxide film but also at the surface of the oxide film to generate SiO. In FIG. 14, SiO generated at the interface between the Si substrate and the oxide film and SiO generated at the surface of the oxide film are indicated distinguishably by circles hatched in different directions. Since SiO generated at the surface of the oxide film evaporates directly into the atmosphere, the mechanism thereof dominates the mechanism of SiO generated at the interface between the Si substrate and the oxide film, which is diffused in the oxide film and then evaporates. Accordingly, it can be considered that the thickness of the oxide film is reduced relatively uniformly in $Si_2H_6$. In this case also, however, a hole is formed through the partial removal of the oxide film partly because the reaction for removing the oxide film due to the evaporation of SiO generated at the interface between the Si substrate and the oxide film proceeds simultaneously. Once the hole is formed, the reaction for removing the oxide film due to the direct evaporation into vacuum of SiO resulting from the reaction between Si and $SiO_2$ at the bottom portion of the hole is initiated. In short, the enlargement of the hole is initiated.

When $Si_2H_6$ is used, it can be considered that the reaction for removing the oxide film due to the generation of SiO at the interface between the Si substrate and the oxide film and the reaction for removing the oxide film due to the generation of SiO at the surface of the oxide film proceed in phase 1 and the reaction for removing the oxide film due to the generation of SiO at the interface between the Si substrate and the oxide film, the reaction for removing the oxide film due to the generation of SiO at the surface of the oxide film, and the reaction for removing the oxide film due to the generation of SiO at the edge of the bottom of the hole proceed mixedly in phase 2. As a result, the reaction for removing the oxide film is completed in a far shorter time than in vacuum. In addition, the model rationally illustrates the phenomenon in which the reaction for removing the oxide film proceeds at a higher speed by using $Si_2H_6$ than in vacuum.

However, since $Si_2H_6$ may also serve as a gas used for epitaxially growing a Si crystal film, it may be assumed that, when $Si_2H_6$ is used, a Si crystal film is formed partially on the Si substrate after the removal of the oxide film is completed. The Si crystal film is grown on the Si substrate exposed at the bottom of the hole formed in phase 2.

Even if a gas other than $Si_2H_6$ (disilane) is used, the same mechanism of the reaction for removing the oxide film as in the case of using $Si_2H_6$ can be achieved so long as the gas reacts with $SiO_2$ to generate SiO.

Summary of Reaction for Removing Oxide Film

The following is the summary of the reaction for removing the oxide film described above.

(1) The process of decomposing the oxide film proceeds not in such a manner that the thickness of the film decreases gradually monotonously but in such a manner that phase 1 as the process in which SiO is diffused in the oxide film and then evaporates with the oxide film covering the entire substrate shifts to phase 2 as the process in which a hole is formed in a part of the oxide film and enlarged gradually.

(2) each of $\Psi$ and $\Delta$ which are the signals obtained by in-situ ellipsometric measurement increases as the reaction for decomposing the oxide film proceeds and becomes constant at the completion of the removal of the oxide film. In addition, the increase rate of $\Delta$ is lower in phase 1 and higher in phase 2.

(3) The process of decomposing the oxide film is a thermal excitation process in each of phases 1 and 2. If the substrate temperature is increased, the reaction proceeds more rapidly. At this time, activation energy is lower in phase 2 than in phase 1. If $Si_2H_6$ is introduced during the process of removing the oxide film, the activation energy of the reaction can be lowered.

DETAILED CONTROL OF CONDITIONS IN FABRICATION PROCESS

Based on the foregoing findings, conditions in the process of removing the oxide film can be controlled as follows.

Changing of Conditions for Removing Oxide Film in Phase 1 and Phase 2 a. Control of Gas Flow Rate

Since $Si_2H_6$ lowers the activation energy of the reaction for removing the oxide film in either of phases 1 and 2, the heating temperature during the removal of the oxide film can be lowered or the time required for the removal of the oxide film can be reduced if $Si_2H_6$ is allowed to flow constantly during the process of removing the oxide film.

However, since $Si_2H_6$ also serves as the gas used as a source gas for the growth of a Si crystal, if the hole is formed in the oxide film and phase 1 shifts to phase 2, the clean substrate crystal surface is partially exposed and the growth of the Si crystal is initiated at the exposed portion. It follows that a silicon layer in an island configuration exists locally between the Si substrate 101 and the Si relaxed buffer layer 102 in the device shown in FIG. 16, which degrades the smoothness of the substrate. In the process of fabricating a Si/SiGe hetero bipolar transistor in which a p-type doped SiGe base layer is grown on an n-type substrate as a collector, the undoped Si layer is sandwiched between the collector layer and the base layer so that the properties of the bipolar transistor are degraded particularly significantly. In a device in which carries are allowed to travel along the interface between the Si substrate and the SiGe epitaxially grown layer or the like, if silicon is grown locally in an island configuration, the scattering of the carriers travelling in the channel is aggravated to cause the degradation of the device properties including a reduced travelling speed.

To prevent or suppress such unintended crystal growth, therefore, the supply of $Si_2H_6$ is preferably halted in phase 2 or the amount of $Si_2H_6$ supplied is preferably reduced compared with the amount of $Si_2H_6$ supplied in phase 1. If the halting of the supply of $Si_2H_6$ is effected within the period of phase 1, unintended crystal growth can be prevented. However, as the supply of $Si_2H_6$ is halted at an earlier stage, the time required till the completion of the oxide film removing process is elongated.

To prevent this, the present embodiment controls conditions for removing the oxide film based on the following concept. Since the oxide film is covering the entire surface of the silicon substrate in phase 1, there is no possibility that a Si crystal grows if a $Si_2H_6$ gas or the like is supplied in an amount as large as possible during the period. If a $Si_2H_6$ gas or the like is supplied during the entire period of phase 1 and the supply of $Si_2H_6$ is halted at the shift point from phase 1 to phase 2, the time required for the removal of the oxide film under the conditions that can suppress unintended crystal growth is ideally minimized. From the data shown in FIGS. 3 and 4, it will be understood that the total period required for the removal of the oxide film at the substrate temperature (800° C.) can be reduced by a time reduction achieved by switching the vacuum atmosphere used conventionally in the first-half process to a $Si_2H_6$ gas or the like.

As will be described later, there are cases where an extremely small amount of hydrogen or the like is allowed to flow after the supply of gas is halted, though in a nearly vacuum atmosphere, with the view to preventing re-adhesion of an impurity to the surface of the substrate. In that case also, the atmosphere may be regarded as a substantially vacuum atmosphere as far as the removal of the oxide film is concerned since a hydrogen gas or the like does not contribute to the purification of a volatile material.

However, it is actually difficult to perform a control operation for changing conditions at the shift point from phase 1 to phase 2 without causing a time delay. Hence, the present invention has provided means for determining a timing of the switching of the control operations, which will be described later.

b. Control of Substrate Temperature

Conventionally, the substrate temperature has been held constant from the initiation of the oxide film removing process till the completion thereof. By varying the substrate temperature depending on the progression of the reaction for removal, the following advantages are offered.

First, the following advantage is obtained by increasing the heating temperature in phase 1.

Since the dependence of the reaction speed on the temperature increases as activation energy is higher, the effect of reducing time required for removing the oxide film can be increased by increasing the substrate temperature. On the other hand, the substrate temperature increased over the entire period may degrade the properties of the semiconductor device to be formed if the total period of the oxide film removing process is constant. Therefore, the substrate temperature is preferably increased in either one of the periods of phases 1 and 2.

In that case, the activation energy of the reaction in phase 2 is lower than the activation energy in phase 1, as shown in FIG. 9 and 10. To minimize the time period during which the substrate temperature is held maximum, a greater effect of accelerating the reaction for removing the oxide film is achieved by increasing the substrate temperature in phase 1 during which activation energy is higher. In the case of growing a crystal on a substrate having a structure which is particularly susceptible to a property change when it is held at a high temperature, if phase 1 is thus provided with a high-temperature portion and the substrate temperature is thus lowered in phase 2, the total amount of added heat can be reduced so that the lowering of the substrate temperature is particularly effective.

Although the activation energy of the reaction is lower in phase 2 than in phase 1, the reaction for removal can be nonetheless accelerated by increasing the substrate temperature. In phase 2, a hole is formed locally to expose the clean silicon surface and the exposed portion is gradually enlarged so that the initially exposed portion remains exposed for a long period of time. Accordingly, the probability that an extremely small amount of impurity existing in the crystal growing apparatus adheres to the initially exposed portion is increased. Since the clean silicon surface in the portion initially exposed in the hole remains exposed for a longer period of time as the substrate temperature is lowered in phase 2, if a small amount of impurity remaining on the substrate presents a problem, it is preferable to increase the heating temperature in phase 2 and thereby reduce the time period during which the clean surface of the Si substrate is partially exposed.

Whether the heat temperature should be increased in phase 1 or in phase 2 can be determined selectively in consideration of the structure of a device to be fabricated, conditions in the crystal growing apparatus, and the like.

Timing and Method for Switching

The present invention is characterized in that the flow rate of the gas (switching of the atmosphere) and the substrate temperature are optimized in each phase based on the finding that the reaction for removing the oxide film proceeds in two stages in phases 1 and 2. Accordingly, the determination of the point at which the setting of the conditions of the apparatus (gas flow rate, substrate temperature, or the like) which affect the reaction for removal is changed is an important point in practicing the invention. Therefore, a description will be given to individual methods of detecting the shift timing between phases 1 and 2.

a. Method of Using Change in Increase Rate of Signal for In-Situ Ellipsometric Measurement.

The point at which phase 1 shifts to phase 2 can be detected by using variations in the signals for in-situ ellipsometric measurement, particularly an increase in the Increase rate of $\Delta$ (Delta) that has been low previously. in accordance with the method, e.g., the point C shown in FIG. 4 is detected and determined to be the point at which the control operation should be switched.

When the flow rate of a $Si_2H_6$ gas or the like and the substrate temperature are thus controlled individually for each substrate by using as a trigger the shift between phases 1 and 2 which has been detected by in-situ ellipsometric measurement, the thickness of the oxide film or the like fluctuates (varies) from substrate to substrate. Even if the progression of the reaction for removing the oxide film varies from one substrate to another, the advantage is offered that the flow rate and the substrate temperature can be controlled properly by reliably detecting the shift point between phases 1 and 2. Although the absolute value of the signal ($\Delta$) obtained by in-situ ellipsometric measurement fluctuates slightly if the angle between the substrate surface and measuring light upon mounting the substrate varies slightly from substrate to substrate or the substrate temperature varies slightly from substrate to substrate, a variation itself in the increase rate of the signal ($\Delta$) is unaffected by the variations so that the reproducibility of the control operation is high.

Even if the completion of phase 1 was detected accurately, a certain period of time is required between the detection of the signal and actual changing of the conditions including gas flow rate and temperature substrate. Even if the supply of $Si_2H_6$ is halted, moreover, there is the possibility that $Si_2H_6$ or the like remains for a while in the crystal growing apparatus.

Furthermore, slight noise is superimposed on the value of the signal $\Delta$ as shown in FIG. 4, similarly to every physical measurement. With the changing of the signal during an extremely short period of time, there are cases where it becomes difficult to determine whether the changing results from the phase-to-phase shift in the oxide film removing process or from the noise. To recognize the phase-to-phase shift by positively removing the influence of the noise, a time sufficiently long to neglect the influence of the noise should elapse from an actual shift, which may cause a further delay in the control operation. Specifically, if the supply of $Si_2H_6$ is halted after the shift to phase 2 is detected by ellipsometric measurement, $Si_2H_6$ may be allowed to flow in a small amount during the early period of phase 2.

In general, $Si_2H_6$ allowed to flow during the early period of phase 2 due to a certain delay in the control operation does not present a problem. However, there are cases where such a delay in the control operation should be avoided absolutely depending on the type of a device to be grown in terms of device properties. In this case, such a method using the absolute value of the signal ($\Delta$) obtained by ellipsometric measurement as follows is used preferably.

b. Method of Using Absolute Value of Signal Obtained by Ellipsometric Measurement The problem of the delay in the control operation described in the foregoing column a. can be solved easily by using the absolute value of the signal ($\Delta$) obtained by ellipsometric measurement. As shown in FIG. 4, the variations in $\Delta$ in phase 1 are mild but increased nearly monotonously. This allows the prediction of a time which will elapse from now to the shift point from phase 1 to phase 2 based on the value of $\Delta$ currently detected. Although FIG. 4 shows the ellipsometric signal $\Delta$ when heating is performed in a vacuum atmosphere, the ellipsometric signal $\Delta$ when $Si_2H_6$ or the like is supplied exhibits variations in basically the same pattern except that the increase rate of the ellipsometric signal $\Delta$ is different. Therefore, a description will be given to a method of controlling a timing of halting the supply of the gas, while allowing a $Si_2H_6$ gas or the like to flow, by using, as a substitute, the pattern of FIG. 4 in which the ellipsometric signal $\Delta$ varies.

In accordance with the method, e.g., a timing T0.7 at which a period corresponding to 70% of the time required from the timing T0 for the initiation of phase 1 to the timing T1 for the shift from phase 1 to phase 2 has elapsed is detected from the signal$\Delta$ such that the shift timing T1 subsequent to that is calculated. The timing T0.7 is, e.g., a timing of detecting a signal value $\Delta 0.7$ having a difference of 0.7 between itself and the signal value $\Delta 0$ if the difference between the signal value $\Delta 0$ at the timing T0 for the initiation of phase 1 and the signal value $\Delta 1$ at the completion of phase 1 is assumed to be 1. In that case, even when noise is superimposed on the signal $\Delta$, the process of calculating a mean value can be omitted by using peak values of noise-induced variations as the individual signal values $\Delta 0$, $\Delta 0.7$, and $\Delta 1$. Unlike the shift from phase 1 to phase 2, the value of the signal $\Delta$ increases relatively monotonously so that there is no possibility that detection accuracy is reduced significantly even when the peak values of the noise-induced; variations are adopted as the signal values.

In predicting the shift point from phase 1 to phase 2, the supply of $Si_2H_6$ or the like may be halted at the point at which the reaction for removing the oxide film reaches a specified proportion in phase 1, not at the shift point from phase 1 to phase 2. By thus halting the supply of a $Si_2H_6$ gas or the like previously to the shift point from phase 1 to phase 2, not by halting the supply of the gas at the point at which phase 1 positively shifts to phase 2, it becomes possible to reliably prevent the operation of allowing $Si_2H_6$ to flow even after the shift to phase 2. By halting the supply of the gas earlier than the actual shift timing in consideration of the gas remaining in the vacuum vessel for a certain period of time even after the supply of the gas is halted, a control operation can be performed such that the gas has been removed reliably from inside the vacuum vessel at the point at which phase 2 is initiated. In the case where a Si crystal barely grows on a Si substrate exposed in an opening even if a $Si_2H_6$ gas or the like is supplied continuously for a certain period of time or where the growth of the Si crystal is slight and negligible, it is also possible to perform a control operation such that the supply of the gas is intentionally continued till a certain period of time elapses after the shift to phase 2 so long as the properties of the device do not suffer trouble.

By thus halting the supply of a $Si_2H_6$ gas or the like after recognizing the progression of the reaction for removing the oxide film, while making actual observation by ellipsometric measurement, such trouble as caused by halting the supply of a $Si_2H_6$ gas or the like earlier than necessary, which makes it impossible to provide a sufficient effect of promoting the reaction for removing the oxide film, or by supplying by mistake $Si_2H_6$ or the like even after the shift to phase 2 can be prevented reliably. As a result, it becomes possible to allow a $Si_2H_6$ gas or the like to flow in a proper amount for a proper period of time.

If the progression of the reaction for removing the oxide film can be judged by thus detecting the absolute value of the signal $\Delta$, variations in the state of the oxide film at the final stage of the removing process can be suppressed based on the fluctuations of the initial thickness of the oxide film. If the reaction for removing the oxide film is slower than usual, e.g., the variations in the state of the oxide film at the final stage of the removing process can be suppressed by increasing the substrate temperature or increasing the flow rate of $Si_2H_6$ and thereby accelerating the reaction for removing the oxide film.

c. Use of Both Control Methods

The method of predicting the shift timing by using an absolute value obtained by measurement described in the column b. and the method of detecting the shift from phase 1 to phase 2 described in the column a. can be used. simultaneously. If the flow rate of $Si_2H_6$ is increased sufficiently and reduced when 90%, e.g., of phase 1 has elapsed assumedly in accordance with the method using the absolute value and then the supply of $Si_2H_6$ is halted when phase 2 is initiated in accordance with the method described in the column b., unintended growth of the Si crystal can be suppressed more positively than in accordance with the method described above in the column a. by lowering the flow rate of $Si_2H_6$ which is allowed to flow after phase 2 is initiated. Moreover, the time required to remove the oxide film can be reduced more positively by allowing $Si_2H_6$ to flow immediately before the shift from phase 1 to phase 2 than in accordance with the method in which the supply of $Si_2H_6$ is halted completely when 90% of phase 1 has elapsed.

In that case, it is also possible to save the time for removing the influence of noise by using, as signal values, the peak values of the noise-induced variations.

d. Control under Fixed Conditions

Feedback control by real-time measurement as described above is preferable in terms of reproducibility but has the disadvantage that monitoring should be performed every time by ellipsometric measurement. If an experiment is conducted preliminarily by ellipsometric measurement to provide sufficiently high reproducibility, the following method can also be adopted.

In general, if conditions (such as oxide film thickness, substrate temperature, and gas atmosphere) for the reaction for removing the oxide film are assumed to be ideally equal, the progression thereof should be basically equal. Specifically, if the reaction for removing the oxide film is observed by in-situ ellipsometric measurement under conditions used in actual fabrication (condition for forming oxide film, substrate temperature, and gas atmosphere) and the periods required by phases 1 and 2 are measured previously, a control operation can be performed based on the measured time if the oxide film is removed by reproducing the same conditions thereafter. In other words, the correlation between the conditions used in actual fabrication and the timing of the shift from phase 1 to phase 2 is obtained previously such that the shift timing under conditions actually used is determined based on the correlation. At this time, if conditions during fabrication including the gas flow rate and the substrate temperature are varied and the correlation between each of the conditions and the shift timing is determined individually, the conditions including the gas flow rate and the substrate temperature can be controlled constantly properly under each of the conditions that can be used in actual fabrication.

Even though the experiment is not performed at all the temperatures used actually, if only experimental data is obtained under at least two conditions at different substrate temperatures, the periods of phases 1 and 2 can be estimated at the different temperatures shown in FIGS. 12 and 13 based on the fact that phases 1 and 2 are thermal excitation processes having different activation energies (see FIGS. 9 and 10).

Thus, if the period of phase 1 can be estimated, the conditions can be determined by circumventing trouble resulting from the effect of removing the oxide film caused by the introduction of $Si_2H_6$ gas or the like or from unintended crystal growth caused by allowing $Si_2H_6$ to flow even after phase 2 is initiated. If the time required for removing the oxide film is to be minimized by introducing the $Si_2H_6$ gas or the like, for example, $Si_2H_6$ may be allowed to flow appropriately during the period of phase 1 which has been obtained by experiment. If the likelihood of trouble is to be minimized, e.g., a $Si_2H_6$ gas or the like may be allowed to flow appropriately only for the early period of phase 1 corresponding to 50% of the total period thereof. The proportion of the early period of phase 1 during which $Si_2H_6$ is allowed to flow to the total period thereof can be determined through a comparison between the foregoing effects and trouble.

If the supply of a $Si_2H_6$ gas or the like is halted excessively early, the effect achieved by reducing the period for removing the oxide film is reduced, so that a $Si_2H_6$ gas or the like is preferably allowed to flow during the period corresponding to 50% or more of the total period of phase 1. If a consideration is given to delayed control or to the gas remaining even after the supply of the gas is halted, the period during which a $Si_2H_6$ gas or the like is allowed to flow is preferably limited to the period corresponding to 95% or less of the total period of phase 1.

If the proportion of the period during which a $Si_2H_6$ gas or the like is supplied to the total period of phase 1 is determined based on fluctuations obtained statistically, a higher effect can be achieved. That is, if variations in the results of measuring the respective periods of phases 1 and 2 for determining conditions are small, smaller variations in the timing of the shift from phase 1 to phase 2 are expected during actual device fabrication, so that the possibility of allowing $Si_2H_6$ to flow in phase 2 by mistake is low even when $Si_2H_6$ has been allowed to flow during a considerable period of phase 1. If variations in the results of measuring the periods for determining conditions are large, on the other hand, larger variations in the timing of the shift from phase 1 to phase 2 are expected even during actual device fabrication, so that the possibility of allowing $Si_2H_6$ to flow in phase 2 by mistake is high unless the supply of $Si_2H_6$ is halted at an earlier stage. However, if a sufficiently large number of measurement experiments are conducted preliminarily to obtain statistics about the variations in shift timing, it becomes possible to determine such a condition as a time which precedes the initiation of phase 2 with a 99% probability.

Since such a method of using fixed conditions alleviates the necessity to attach the in-situ ellipsometric measuring apparatus to each of a plurality of crystal growing apparatus used in cleaning substrates by removing oxide films during commercial mass fabrication, fabrication cost can be reduced.

Other Control Methods

Although the description has been given primarily to the control of the flow rate of a $Si_2H_6$ gas or the like in association with the detection of the timing of the shift from phase 1 to phase 2 and the timing of switching the control operations, the detection of the switching timing and the control of conditions for fabrication is similarly applicable to the control of the substrate temperature.

In that case, a method of determining the timing of controlling the flow rate of a $Si_2H_6$ gas or the like and a method of determining the timing of controlling the substrate temperature can be selected independently of each other. Even when the same method, e.g., the method using fixed conditions is selected, the proportion of the period which elapses until the supply of a $Si_2H_6$ gas or the like is halted to the total period of phase 1 and the proportion of the period which elapses until the substrate temperature is changed to the total period of phase 1 can be determined differently in such a manner that the supply of $Si_2H_6$ gas or the like is halted when the period corresponding to 50% of the total period required by phase 1 has elapsed and the substrate temperature is changed when the period corresponding to 90% of the total period required by phase 1 has elapsed.

Although $Si_2H_6$ has been used as an example of the gas introduced into the crystal growing apparatus in the embodiment, the present invention is applicable to all gases having the function of reacting with the oxide film and generating a highly volatile material such as silicon hydrates including $SiH_4$ and other Si-containing gases or Ge-containing gasses such as $GeH_4$. The material having high volatility is not limited to SiO.

The crystal growing apparatus and fabrication method according to the present invention is also applicable to the case where it is necessary to clean a substrate by RCA or the like before a Si layer is formed on, e.g., a SiGe layer.

Although the present embodiment has removed the oxide film primarily in a vacuum atmosphere after halting the supply of the gas having the function of purifying a volatile material such as $Si_2H_6$ (in the second-half process), there may be cases where the oxide film is removed by allowing a small amount of hydrogen or the like to flow with the view to preventing readhesion of an impurity. In those cases also, the atmosphere may be regarded as a substantially vacuum atmosphere in terms of removing the oxide film since hydrogen does not contribute to the generation of a volatile material. Briefly, the present invention is also applicable to the case where a small amount of hydrogen is allowed to flow in the second-half process.

Industrial Applicability

The apparatus for fabricating a semiconductor device and the fabrication method therefor can be used for the fabrication of various transistors to be mounted on electronic equipment.

What is claimed is:

1. An apparatus for fabricating a semiconductor device to be used in removing an oxide film formed on a semiconductor substrate therefrom, the apparatus comprising:
    a vacuum vessel for accommodating the semiconductor substrate;
    a substrate heating unit provided additionally in the vacuum vessel to heat the semiconductor substrate in the vacuum vessel;
    a gas supply unit for supplying a gas having a function of reacting with the oxide film and generating a volatile material within the vacuum vessel;
    a polarized light analyzing unit for detecting a state of the oxide film on the semiconductor substrate after the removing process based on a signal $\Delta$ representing a difference in phase shift between p-polarized light and s-polarized light of polarized measuring light; and
    a control unit for controlling a condition during the removal of the oxide film on the semiconductor substrate therefrom in accordance with the signal $\Delta$ detected by the polarized light analyzing unit.

2. The apparatus of claim 1, wherein the control unit has a function of determining a timing of switching between a process of supplying the gas to the vacuum vessel and a process of removing the oxide film in an atmosphere in which the gas does not substantially exist without supplying the gas.

3. The apparatus of claim 1, the apparatus functioning as an apparatus for epitaxial growth.

4. A method of fabricating a semiconductor device, the method comprising the step of removing an oxide film formed on a semiconductor substrate therefrom in a vacuum vessel, wherein the step of removing the oxide film includes allowing to flow a gas which reacts with the oxide film and generates a volatile material within the vacuum vessel, while heating the semiconductor substrate, until a specified time elapses from an initiation of the step of removing the oxide film, and removing the oxide film in an atmosphere in which the gas does not substantially exist by halting a supply of the gas to the vacuum vessel and heating the semiconductor substrate after the specified time elapsed.

5. The method of claim 4, wherein, if a period that has elapsed since the process of removing the oxide film is initiated until the oxide film is partially lost and a part of the underlying semiconductor substrate is exposed is assumed to be a phase 1 and a period that has elapsed since the underlie is partially exposed until the removal of the oxide film is completed is assumed to be a phase 2 in the step of removing the oxide film, a specified time point at which the supply of the gas is halted is determined based on a timing with which the phase 1 shifts to the phase 2.

6. The method of claim 5, wherein the process of removing the oxide film is monitored by an analysis of polarized light for detecting the signal $\Delta$ representing a difference in phase shift between p-polarized light and s-polarized light of polarized measuring light, the timing with which the phase 1 shifts to the phase 2 is detected from data obtained from the analysis of polarized light, and the specified time point at which the supply of the gas is halted is controlled based on the detected timing.

7. The method of claim 6, wherein a time point at which an elapsed time from an initiation of the phase 1 reaches a specified proportion of a time required from the initiation of the phase 1 to a termination thereof is detected and the specified time point at which the supply of the gas is halted is determined based on the detected time point.

8. The method of claim 7, wherein the specified proportion is not less than 50% and not more than 95%.

9. The method of claim 6, wherein at least one of respective control operations for changing a flow rate of the gas, changing a pressure of the gas, and changing a temperature of the substrate in the process of allowing the gas to flow is conducted based on the data obtained from the analysis of polarized light.

10. The method of claim 6, wherein the substrate is held at a constant temperature in conducting the analysis of polarized light.

11. The method of claim 4, wherein the step of removing the oxide film is the step of removing an oxide film for protection before a semiconductor crystal layer is epitaxially grown on the semiconductor substrate.

12. A method of fabricating a semiconductor device, the method comprising the step of removing an oxide film formed on a semiconductor substrate therefrom in a vacuum vessel, wherein the step of removing the oxide film includes monitoring a state of the oxide film on the semiconductor substrate after the removing process by an analysis of polarized light for detecting a signal $\Delta$ representing a difference in phase shift between p-polarized light and s-polarized light of polarized measuring light and controlling a condition for removing the oxide film based on data obtained from the analysis of polarized light.

13. The method of claim 12, wherein the substrate is held at a constant temperature in conducting the analysis of polarized light.

14. The method of claim 12, wherein
    the step of removing the oxide film includes a process of allowing to flow a gas which reacts with the oxide film and generates a volatile material within the vacuum vessel, while heating the substrate, and
    the control of the condition is at least one of control operations for changing an amount of the gas supplied, changing a pressure of the gas, and changing a temperature of the substrate in the process of allowing the gas to flow.

15. The method of claim 12, wherein the step of removing the oxide film is the step of removing an oxide film for protection before a semiconductor crystal layer is epitaxially grown on the semiconductor substrate.

16. A method of fabricating a semiconductor device, the method comprising the step of removing an oxide film formed on a semiconductor substrate therefrom in a vacuum vessel, wherein
    the step of removing the oxide film is assumed to include allowing to flow a gas which reacts with the oxide film and generates a volatile material within the vacuum vessel, while heating the semiconductor substrate, until a specified time elapses from an initiation of the oxide film removing process, and removing the oxide film in an atmosphere in which the gas does not substantially exist by halting a supply of the gas to the vacuum vessel and heating the semiconductor substrate after the specified time elapsed,
    a correlation between progression of the removal of the oxide film and at least one of a flow rate of the gas, a pressure of the gas, and a temperature of the substrate is obtained by an analysis of polarized light for detecting a signal $\Delta$ representing a phase shift difference between p-polarized light and s-polarized light of measuring light that has been polarized preliminarily, and the step of removing the oxide film includes halting the supply of the gas at the specified time determined based on the correlation.

17. The method of claim 16, wherein, if a period that has elapsed since the oxide film removing process is initiated until the oxide film is partially lost and a part of the underlying semiconductor substrate is exposed is assumed to be a phase 1 and a period that has elapsed since an underlie is partially exposed until the removal of the oxide film is completed is assumed to be a phase 2, the correlation between the progression of the removal of the oxide film and the condition is a correlation between a time required by the phases 1 and 2 and the condition.

18. The method of claim 4, wherein the gas contains at least one of Si and Ge.

19. The method of claim 18, wherein the gas contains at least one of disilane and silane.

20. The method of claim 18, wherein the gas contains germane.

21. A method of fabricating a semiconductor device, the method comprising the step of removing an oxide film formed on a semiconductor substrate therefrom in a vacuum vessel, wherein if a period that has elapsed since the oxide film removing process is initiated until the oxide film is partially lost and a part of the underlying semiconductor substrate is exposed is assumed to be a phase 1 and a period that has elapsed since the underlie is partially exposed until the removal of the oxide film is completed is assumed to be a phase 2 in the step of removing the oxide film, the substrate has different maximum temperatures in the phase 1 and in the phase 2.

22. The method of claim 21, wherein the maximum temperature of the substrate in the phase 1 is higher than the maximum temperature of the substrate in the phase 2.

23. The method of claim 21, wherein the step of removing the oxide film includes allowing to flow a gas which reacts with the oxide film and generates a volatile material within the vacuum vessel, while heating the semiconductor substrate, until a specified time elapses from the initiation of the oxide film removing process, and removing the oxide film in an atmosphere in which the gas does not substantially exist by halting a supply of gas to the vacuum vessel and heating the semiconductor substrate after the specified time elapsed.

* * * * *